United States Patent
Tominaga

(10) Patent No.: US 10,955,695 B2
(45) Date of Patent: Mar. 23, 2021

(54) DISPLAY DEVICE

(71) Applicant: Sharp Kabushiki Kaisha, Sakai (JP)

(72) Inventor: Masakatsu Tominaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/609,789

(22) PCT Filed: May 11, 2018

(86) PCT No.: PCT/JP2018/018275
§ 371 (c)(1),
(2) Date: Oct. 31, 2019

(87) PCT Pub. No.: WO2018/212084
PCT Pub. Date: Nov. 22, 2018

(65) Prior Publication Data
US 2020/0064667 A1    Feb. 27, 2020

(30) Foreign Application Priority Data
May 18, 2017 (JP) .............................. JP2017-098937

(51) Int. Cl.
*G02F 1/1333*    (2006.01)
*G02F 1/1343*    (2006.01)
*G02F 1/1362*    (2006.01)

(52) U.S. Cl.
CPC .... *G02F 1/13338* (2013.01); *G02F 1/134309* (2013.01); *G02F 1/134336* (2013.01);
(Continued)

(58) Field of Classification Search
CPC ........... G02F 1/13338; G02F 1/134309; G02F 1/136286; G02F 1/134336;
(Continued)

(56) References Cited

U.S. PATENT DOCUMENTS 7,796,106 B2   9/2010  Ha
9,196,736 B2   11/2015 Li
(Continued)

FOREIGN PATENT DOCUMENTS

| JP | 2007-188089 A | 7/2007 |
|----|---------------|--------|
| JP | 2014-056237 A | 3/2014 |
| WO | 2016/136272 A1| 9/2016 |

OTHER PUBLICATIONS

Official Communication issued in International Patent Application No. PCT/JP2018/018275, dated Jul. 31, 2018.

*Primary Examiner* — Jia X Pan
(74) *Attorney, Agent, or Firm* — Keating & Bennett, LLP

(57) ABSTRACT

A liquid crystal display device includes pixel electrodes, a common electrode placed in such a manner that at least part thereof overlaps the pixel electrodes via an inter-transparent-electrode-film insulating film, at least two source lines, placed in such a manner that the pixel electrodes are interposed therebetween, that supply the pixel electrodes with image signals, and a common electrode wire, placed in such a manner that the pixel electrodes that are adjacent to the two source lines between which the pixel electrodes are interposed between the common electrode wire and the source lines, that extends parallel to the source lines and supplies the common electrode with at least a reference potential signal.

13 Claims, 24 Drawing Sheets

(52) U.S. Cl.
CPC .... *G02F 1/136286* (2013.01); *G02F 1/13629* (2021.01); *G02F 1/134372* (2021.01); *G02F 2201/121* (2013.01); *G02F 2201/123* (2013.01)

(58) Field of Classification Search
CPC ... G02F 2001/134372; G02F 2201/123; G02F 2201/121; G06F 3/041; G06F 3/0443
See application file for complete search history.

(56) References Cited

U.S. PATENT DOCUMENTS

| | | | |
|---|---|---|---|
| 2007/0164964 A1 | 7/2007 | Ha | |
| 2009/0135125 A1* | 5/2009 | Park | G02F 1/136286 345/98 |
| 2013/0162570 A1* | 6/2013 | Shin | G06F 3/041 345/173 |
| 2014/0070221 A1* | 3/2014 | Li | H01L 29/78678 257/59 |
| 2016/0253023 A1* | 9/2016 | Aoyama | G06F 3/044 345/174 |
| 2016/0253024 A1* | 9/2016 | Aoyama | G06F 3/0416 345/174 |
| 2016/0327820 A1* | 11/2016 | Wu | G06F 3/044 |
| 2017/0192571 A1* | 7/2017 | Kim | G06F 3/04164 |
| 2017/0285428 A1* | 10/2017 | Seong | G09G 3/3648 |
| 2018/0113364 A1* | 4/2018 | Zou | G06F 3/044 |
| 2018/0231819 A1* | 8/2018 | Xie | G06F 3/0412 |

\* cited by examiner

DISPLAY DEVICE

TECHNICAL FIELD

The present invention relates to a display device.

BACKGROUND ART

A liquid crystal display device described in PTL 1 listed below has been known as an example of a conventional liquid crystal display device. In this liquid crystal display device described in PTL 1, three gate lines are provided for every two adjacent pixel rows. A first gate line is connected to only pixels included in either of the two pixel rows. A second gate line is connected to both pixels included in each pixel row. A third gate line is connected to only pixels included in the other of the two pixel rows. Preferably, a gate-on voltage is applied to every one of the three gate lines at a time for ⅔ times as long as a horizontal period in the order of the first gate line, the second gate line, and then the third gate line. As a result, a period in which a gate-on voltage is simultaneously applied to the pixels included in each pixel row is provided between a period in which a gate-on voltage is applied to only either of the two adjacent pixel rows and a period in which a gate-on voltage is applied to only the other of the two adjacent pixel rows.

RELATED ART DOCUMENT

Patent Literature

PTL 1: Japanese Unexamined Patent Application Publication No. 2007-188089

Problem to be Solved by the Invention

The liquid crystal display device described in PTL 1 listed above makes it possible to reduce vertical stripes or horizontal stripes of unevenness that are entailed by reversal driving. However, PTL 1 does not specifically disclose a configuration for supplying a common voltage to a common electrode that generates an electric field with a pixel electrode that constitutes a pixel. It is conceivable that a common voltage may be supplied to a common electrode, for example, by extending a solid common electrode out of a display area and connecting the extended portion to a wire for supplying a common electrode; however, this results in higher interconnection resistance and may therefore make it hard for the common voltage to stabilize. On the other hand, the routing in the display area of the wire for supplying a common electrode in turn raises concern about a problem such as a decrease in aperture ratio.

DISCLOSURE OF THE PRESENT INVENTION

The present invention was made in view of the above circumstances. An object is to stabilize a reference potential of a common electrode while suppressing a decrease in aperture ratio.

Means for Solving the Problem

A display device of the present invention includes: a plurality of pixel electrodes arranged at spacings from each other; a common electrode placed in such a manner that at least part thereof overlaps the plurality of pixel electrodes via an insulating film; at least two signal lines, placed in such a manner that the pixel electrodes are interposed therebetween, that supply the pixel electrodes with image signals; and a common electrode wire, placed in such a manner that the pixel electrodes that are adjacent to the two signal lines between which the pixel electrodes are interposed are interposed between the common electrode wire and the signal lines, that extends parallel to the signal lines and supplies the common electrode with at least a reference potential signal. In this way, while the common electrode is kept at a reference potential based on the reference potential signal that is supplied by the common electrode wire, the pixel electrodes are charged to potentials based on the image signals that are supplied by the signal lines. A display is done on the basis of potential differences that are generated between the common electrode and the pixel electrodes. The reference potential signal is supplied to the common electrode by the common electrode wire placed in such a manner that a pixel electrode that is adjacent to two signal lines between which a pixel electrode is interposed is interposed between the common electrode wire and a signal line; therefore, a reduction in interconnection resistance against the transmission of the reference potential signal is achieved in comparison with a case where a common electrode is extended out of the area where the pixel electrodes and the signal lines are placed and a common electrode wire is connected to the extended portion. This keeps the reference potential of the common electrode stable, thereby making display quality high. Moreover, since the common electrode wire is disposed not to overlap the signal lines, the formation of parasitic capacitances between the common electrode wire and the signal lines can be avoided. This keeps the reference potential of the common electrode more stable, thereby making display quality higher. Furthermore, since the common electrode wire placed in such a manner that a pixel electrode that is adjacent to two signal lines between which a pixel electrode is interposed is interposed between the common electrode wire and a signal line are disposed to avoid interposition of a signal line between the common electrode wire and a pixel electrode, the number and arrangement space of signal lines are reduced in comparison with a case where the common electrode wire is disposed so that a signal line is interposed between the common electrode wire and a pixel electrode. This is suitable to achieving higher definition, a narrower frame, a higher aperture ratio, and the like.

Advantageous Effect of the Invention

The present invention makes it possible to stabilize a reference potential of a common electrode while suppressing a decrease in aperture ratio.

BEST MODES FOR CARRYING OUT THE INVENTION

First Embodiment

A first embodiment of the present invention is described with reference to FIGS. 1 to 6. The present embodiment illustrates a liquid crystal display device (position-input-function-equipped display device) 10 including a touch panel function (position input function). Some of the drawings show an X axis, a Y axis, and a Z axis and are drawn so that the direction of each axis is an identical direction in each drawing. Further, FIGS. 3 to 5 and the like show the front side up and the back side down.

Figure 1:
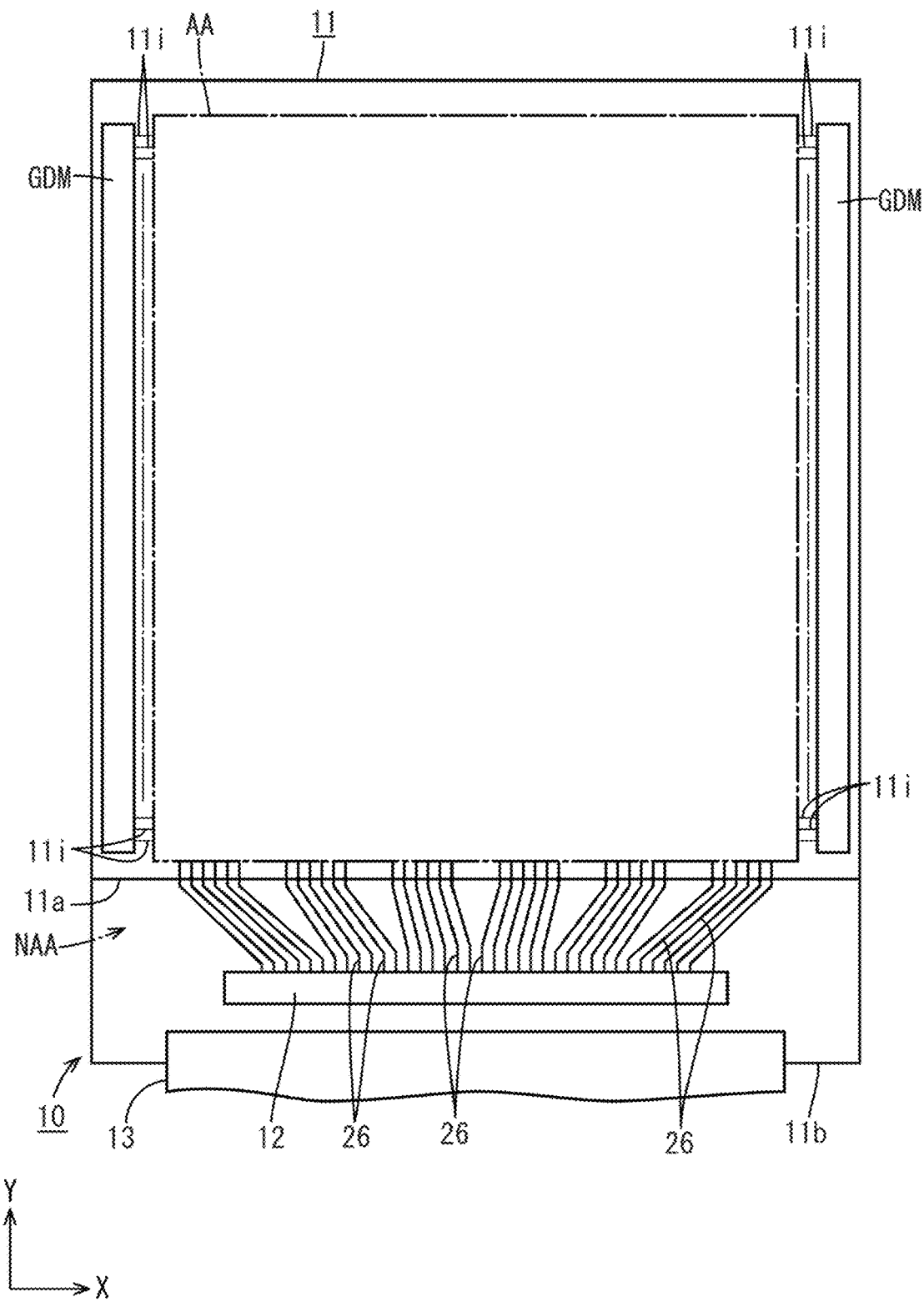
FIG. 1 is a plan view of a liquid crystal panel of a liquid crystal display device according to a first embodiment of the present invention.

As shown in FIG. 1, the liquid crystal display device 10 includes a liquid crystal panel (display panel) 11 that is capable of displaying an image and a backlight device (lighting device) serving as an external light source that illuminates the liquid crystal panel 11 with light for use in display. The backlight device is a known one that is disposed at the back of (i.e. behind) the liquid crystal panel 11, and a specific illustration of the backlight device is omitted. The liquid crystal panel 11 has a display area (i.e. an area surrounded by dot-and-dash lines in FIG. 1) AA where an image is displayed and a non-display area NAA where no image is displayed. The display area AA is a central portion of the screen, and the non-display area NAA is a frame-shaped outer peripheral portion of the screen that surrounds the display area AA. A driver (drive circuit unit) 12 and a flexible substrate (signal transmitting unit) 13 are mounted in the non-display area NAA of the liquid crystal panel 11 as components for supplying various types of signals pertaining to a display function. The driver 12 is constituted by an LSI chip having a drive circuit inside, mounted in the non-display area NAA of the liquid crystal panel 11, and processes various types of signal that are transmitted by the flexible substrate 13. The flexible substrate 13 includes a base material having insulating properties and flexibility and a large number of wiring patterns formed on the base material and, by connecting the liquid crystal panel 11 to a control substrate (signal supply source; not illustrated), transmits, to the liquid crystal panel 11, various types of signal that are outputted from the control substrate. It should be noted that FIG. 1 omits to illustrate an internal configuration of the display area AA.

Figure 2:
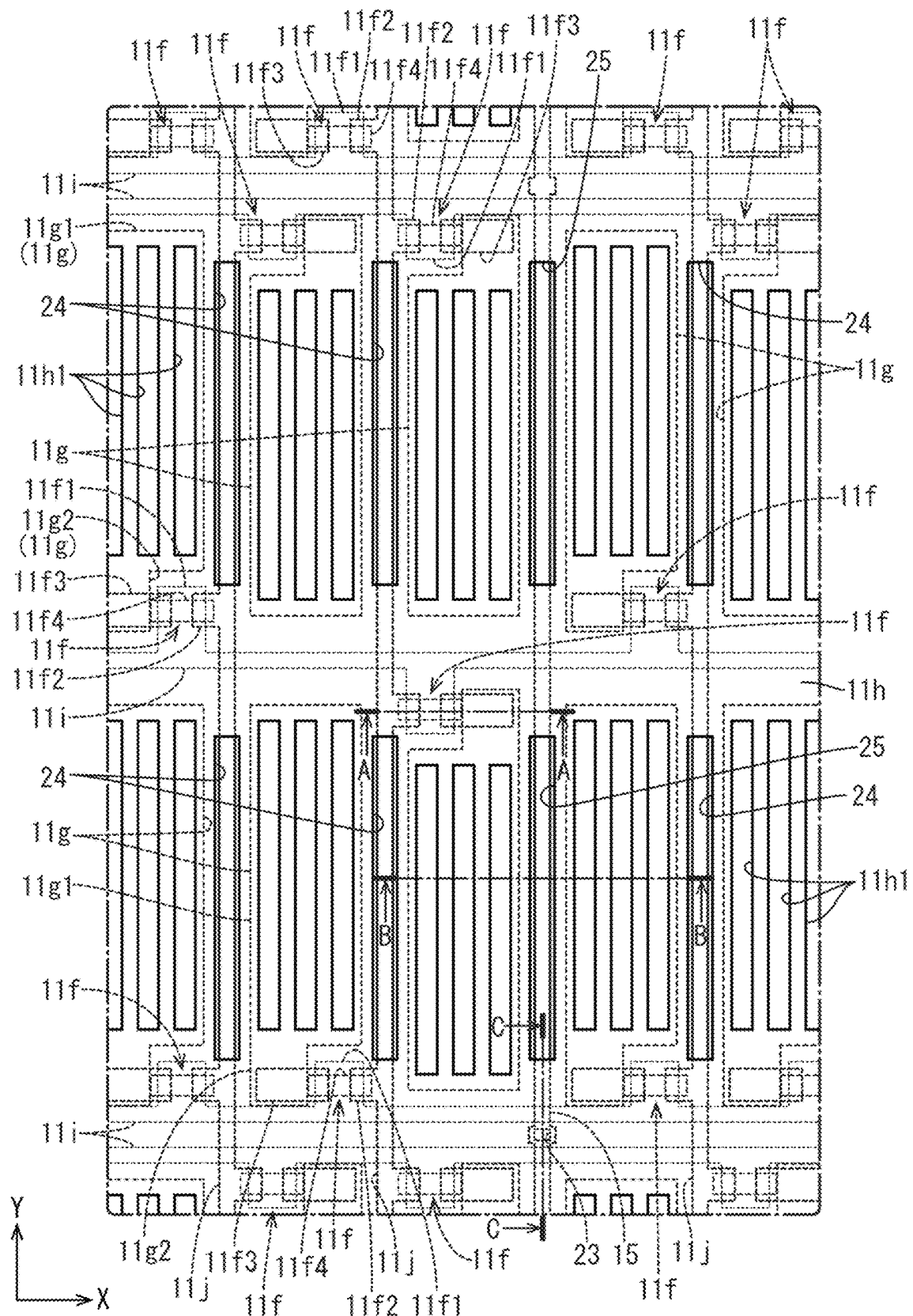
FIG. 2 is a plan view showing a pixel array of an array substrate constituting the liquid crystal panel.
Figure 3:
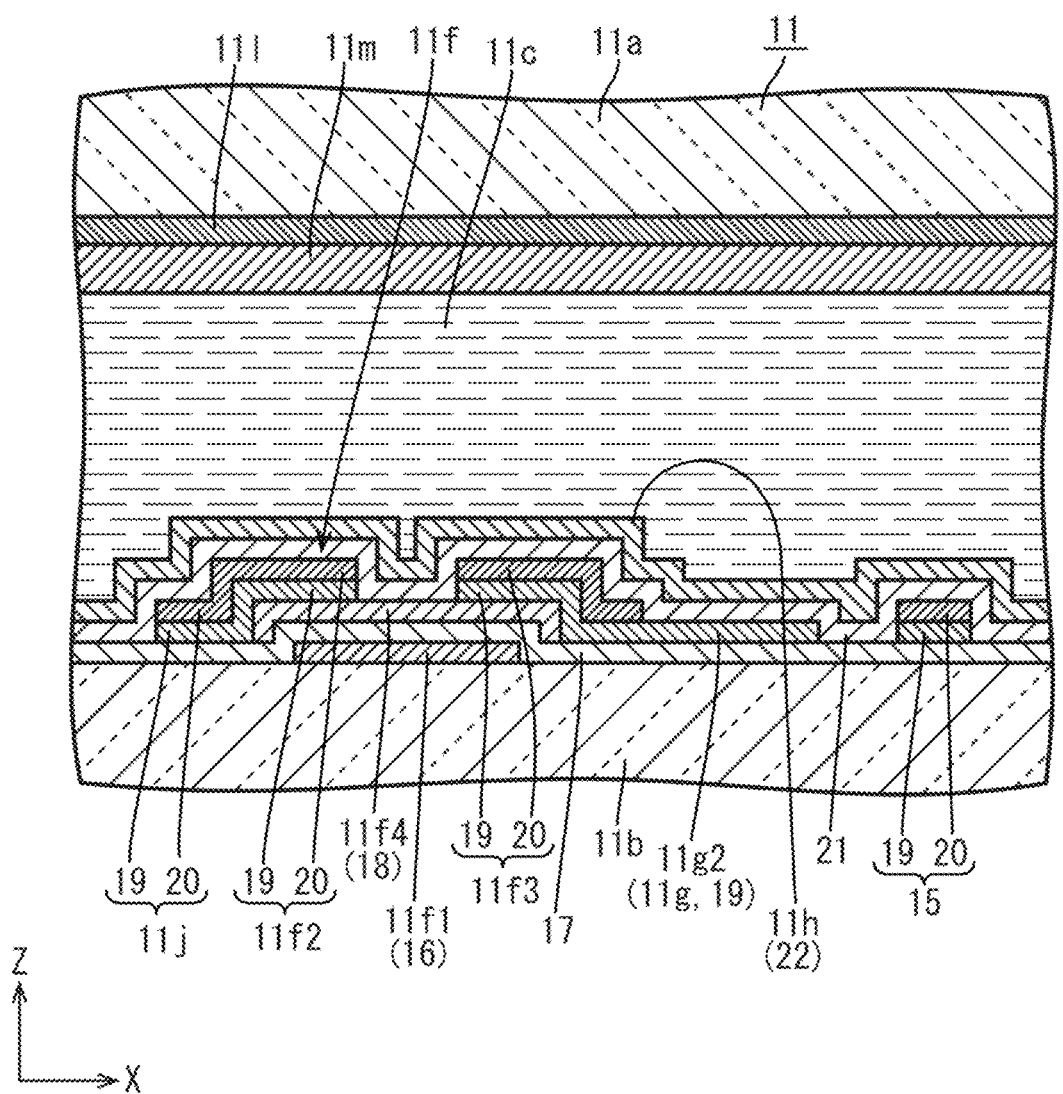
FIG. 3 is a cross-sectional view taken along line A-A in FIG. 2.

As shown in FIG. 3, the liquid crystal panel 11 includes a pair of substrates 11a and 11b and a liquid crystal layer (medium layer) 11c, placed in an internal space between the two substrates 11a and 11b, that contains liquid crystal molecules that constitute a substance whose optical properties vary in the presence of the application of an electric field. That one of the two substrates 11a and 11b which faces the front side is a CF substrate (counter substrate) 11a, and that one of the two substrates 11a and 11b which faces the back side is an array substrate (active matrix substrate, element substrate) 11b. The CF substrate 11a and the array substrate 11b each include a glass substrate and various types of film stacked on the inner side of the glass substrate. As a liquid crystal material of which The liquid crystal layer 11c is made, a negative liquid crystal whose dielectric anisotropy is negative is used. It should be noted that polarizing plates (not illustrated) are attached to the outer sides of the two substrates 11a and 11b, respectively. On the inner side of the array substrate 11b in the display area AA (which faces the liquid crystal layer 11c and which is opposite to the CF substrate 11a), as shown in FIG. 2, a large number of TFTs (switching elements) 11f and a large number of pixel electrodes 11g are arranged in a matrix (rows and columns) at spacings along an X-axis direction (row-wise direction) and a Y-axis direction (column-wise direction). Placed around the TFTs 11f and the pixel electrodes 11g are gate lines (scanning lines) 11i and source lines (signal lines, data lines) 11j that are orthogonal to (cross) each other. While the gate lines 11i extend along the X-axis direction, the source lines 11j extend along the Y-axis direction. The gate lines 11i and the source line 11j are connected to gate electrodes 11f1 and source electrodes 11f2, respectively, of the TFTs 11f, and the pixel electrodes 11g are connected to drain electrodes 11f3 of the TFTs 11f. Moreover, the TFTs 11f are driven in accordance with various types of signal that are supplied to the gate lines 11i and the source lines 11j, and the driving entails control of supply of potentials to the pixel electrodes 11g. The pixel electrodes 11g are substantially vertically long square in planar shape. Their short side direction correspond to the direction of extension of the gate lines 11f, and their long side direction correspond to the direction of extension of the source lines 11j. Further, in the non-display area NAA of the array substrate 11b, as shown in FIG. 1, a gate circuit unit GDM for supplying the gate lines 11i with scanning signals is provided.

Figure 4:
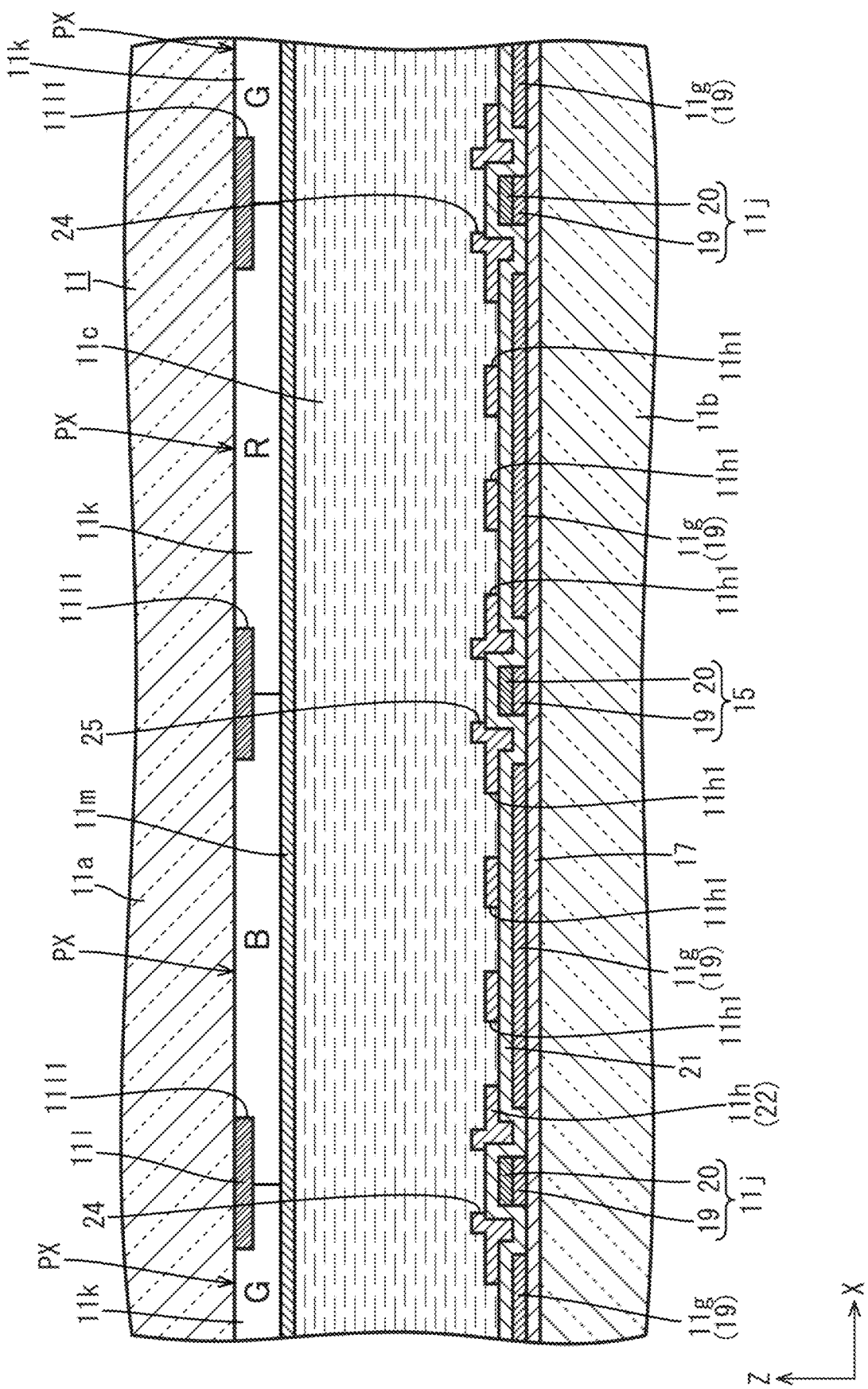
FIG. 4 is a cross-sectional view taken along line B-B in FIG. 2.
Figure 5:
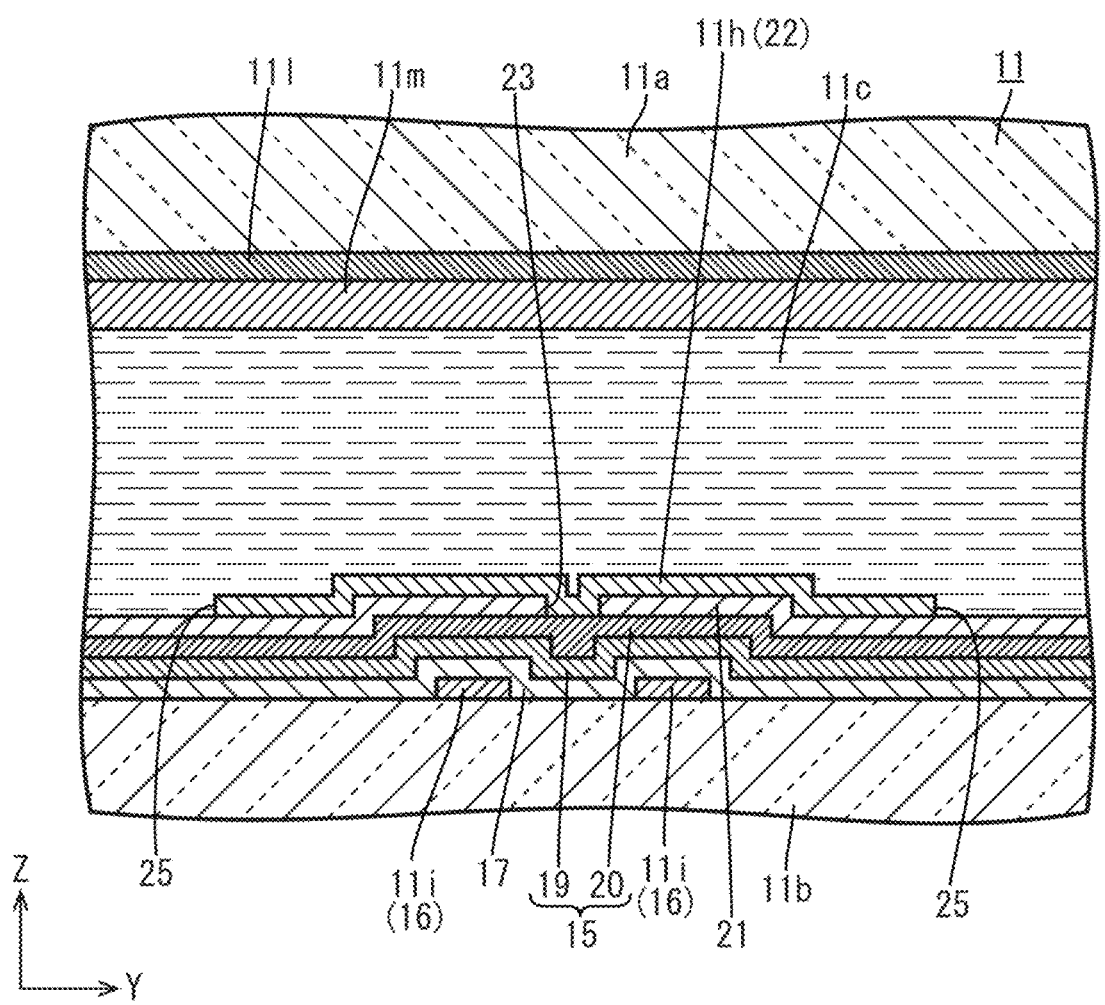
FIG. 5 is a cross-sectional view taken along line C-C in FIG. 2.

On the inner side of the array substrate 11b in the display area AA, as shown in FIGS. 2 and 4, a common electrode 11h is formed at a higher level (closer to the liquid crystal layer 11c) than the pixel electrodes 11g in such a manner as to overlap all of the pixel electrodes 11g. The common electrode 11h is always supplied with a virtually constant reference potential and extends almost all over the display area AA. In a portion of the common electrode 11h that overlaps each pixel electrode 11g (specifically, the aftermentioned pixel electrode body 11g1), a plurality of (in FIG. 2, three) pixel overlap openings (pixel overlap slits, alignment control slits) 11h1 that extend along the long side direction of that pixel electrode 11g are bored. When charging of a pixel electrode 11g entails generation of a potential difference between the pixel electrode 11g and the common electrode 11h, which overlap each other, a fringe field (oblique field) including a component along a substrate plane of the array substrate 11b and a component normal to the substrate plane of the array substrate 11b is generated between the opening edge of a pixel overlap opening 11h1 and the pixel electrode 11g, so that the fringe field can be utilized to control a state of alignment of the liquid crystal molecules contained in the liquid crystal layer 11c. That is, according to the present embodiment, the liquid crystal panel 11 operates in a mode called "FFS (fringe field switching) mode".

On the inner side of the CF substrate 11a in the display area AA, as shown in FIGS. 2 and 4, color filters ilk of three colors that exhibit blue (B), green (G), and red (R) are provided. A large number of these color filters ilk that exhibit different colors from one another are repeatedly arranged along the gate lines 11i (X-axis direction) and, by extending along the source lines 11j (Y-axis direction), are arrayed in stripes as a whole. These color filters 11k overlap the respective pixel electrodes 11g on the side of the array substrate 11b in plan view. A boundary (color boundary) between color filters 11k that are adjacent to each other in the X-axis direction and exhibit different colors from each other overlaps a source line 11j and a light shield 11l to be described next. In this liquid crystal panel 11, R, G, and B color filters 11k arranged along the X-axis direction and three pixel electrodes 11g facing each separate color filter 11k constitute pixel units PX of three colors, respectively. Moreover, in this liquid crystal panel 11, a display pixel that is capable of a color display of a predetermined grayscale is constituted by R, G, and B pixel units PX of three colors that are adjacent to one another along the X-axis direction. The pixel units PX are arrayed at pitches of, for example, approximately 10 µm to 30 µm in the X-axis direction. On the inner side of the CF substrate 11a in the display area AA, a light shield 11l that blocks light is formed. The light shield 11l is in substantially grid fashion in planar shape so as to partition adjacent pixel units PX (pixel electrodes 11g) from one another. In a position of the light shield 11l that overlaps a large portion of a pixel electrode 11g on the side of the array substrate 11b in plan view, the light shield 11l has a pixel opening 11l1 through which to transmit light. As is the case with the pixel electrodes 11, a large number of the pixel opening 11l1 are placed in a matrix arrangement within a substrate plane of the CF substrate 11a. The light shield 11l functions to maintain an independence of the grayscale of each pixel unit PX by preventing light from coming and going between adjacent pixel units PX, and in particular, portions of the light shield 11l1 that extend along the source lines 11j prevent mixture of colors between pixel units PX that exhibit different colors. The light shield 11l is disposed to overlap at least the gate lines 11i and the source lines 11j (including a common electrode wire 15) on the side of the array substrate 11b in plan view. Provided at a higher level than the color filters 11k is a planarization film 11m placed in a solid state almost all over the CF substrate 11a. It should be noted that alignment films (not illustrated) for aligning the liquid crystal molecules contained in the liquid crystal layer 11c are placed on the innermost surfaces of the two substrates 11a and 11b, respectively, that are in contact with the liquid crystal layer 11c.

Various types of film stacked on the inner side of the array substrate 11b are described here. On the array substrate 11b, as shown in FIG. 3, a first metal film 16, a gate insulating film 17, a semiconductor film 18, a first transparent electrode film (conducting film, transparent electrode film) 19, a second metal film (conducting film, metal film) 20, an inter-transparent-electrode insulating film (insulating film) 21, and a second transparent electrode 22 are stacked in this order from a lower level (glass substrate). The first metal film 16 and the second metal film 20 each have electric conductive properties and light-blocking properties by being a single-layer film made of one type of metal material selected from among copper, titanium, aluminum, and the like or a laminated film or alloy made of different types of metal material. The first metal film 16 constitutes the gate lines 11i, the gate electrodes 11f1 of the TFTs 11f, and the like. The second metal film 20 constitutes parts of the source lines 11j and the common electrode wire 15, parts of the source electrodes 11f2 and drain electrodes 11f3 of the TFTs 11f, and the like. The gate insulating film 17 and the inter-transparent-electrode insulating film 21 are each made of an inorganic material such as silicon nitride ($SiN_x$), silicon oxide ($SiO_2$), or the like. The gate insulating film 17 keeps the first metal film 16 at a lower level insulated from the semiconductor film 18, the first transparent electrode film 19, and the second metal film 20 at a higher level. The inter-transparent-electrode insulating film 21 is sandwiched between the first transparent electrode film 19 and the second transparent electrode film 22 (common electrode 11h) at a higher level and between the second metal film 20 (pixel electrodes 11g) and the second transparent electrode film 22 at a higher level to keep them insulated from one another. The semiconductor film 18 is a thin film made, for example, of a material such as an oxide semiconductor or amorphous silicon and constitutes channel parts (semiconductor parts) 11f4 that are connected to the source electrodes 11f2 and drain electrodes 11f3 of the TFTs 11f. The first transparent electrode film 19 and the second transparent electrode film 22 are made of a transparent electrode material (such as ITO (Indium Tin Oxide)). The first transparent electrode film 19 constitutes the pixel electrodes 11g, parts of the source lines 11j and the common electrode wire 15, parts of the source electrodes 11f2 and drain electrodes 11f3 of the TFTs 11f, and the like. The second transparent electrode film 22 constitutes the common electrode 11h and the like.

A configuration of the TFTs 11f and the pixel electrodes 11g is described in detail. As shown in FIGS. 2 and 3, each of the TFTs 11f has a gate electrode 11f1 branching off from a gate line 11i. The gate electrode 11f1 is obtained by causing a portion of the gate line 11*i* that is adjacent to a source line 11*j* to protrude along the Y-axis direction toward a pixel electrode 11*g* to which the TFT 11*f* is connected. The gate electrode 11/1 drives the TFT 11*f* in accordance with a scanning signal that is supplied to the gate line 11*i*. Each of the TFTs 11*f* has a source electrode 11/2 branching off from a source line 11*j*. The source electrode 11/2 is obtained by causing a portion of the source line 11*j* that is adjacent to a gate line 11*i* to protrude along the X-axis direction toward a pixel electrode 11*g* to which the TFT 11*f* is connected, and a tip of the protrusion overlaps a gate electrode 11/1 and is connected to a channel part 11/4. Each of the TFT 11*f* has a drain electrode 11/3 placed in a position at a spacing from a source electrode 11/2. The drain electrode 11/3 has a substantially square shape that extends parallel to the source electrode 11/2. A first end of the drain electrode 11/3 opposite to the source electrode 11/2 overlaps a gate electrode 11/1 and is connected to a channel part 11/4, and a second end of the drain electrode 11/3 is connected to a pixel electrode 11*g*. The source electrode 11/2 and the drain electrode 11/3 have a laminated structure of the first transparent electrode film 19 and the second metal film 20, and the first transparent electrode film 19 at a lower level is in direct contact with the channel part 11/4 constituted by the semiconductor film 18. Meanwhile, the second end of the drain electrode 11/3 is directly joined to the pixel electrode 11*g* (contact portion 11*g*2) constituted by the first transparent electrode film 19. Each of the pixel electrodes 11*g* includes a pixel electrode body 11*g*1 that overlaps a pixel opening 11/1 of a light shield 11*l* and a contact part 11*g*2 that protrudes from the pixel electrode body 11*g*1 along the Y-axis direction toward a TFT 11*f*. Each of the TFTs 11*f* has a channel 11/4 that overlaps a gate electrode 11/1 via the gate insulating film 17 and that is connected to a source electrode 11/2 and a drain electrode 11/3. The channel part 11/4 extends along the X-axis direction in such a manner as to pass transversely across the gate electrode 11/1. A first end of the channel part 11/4 is connected to the source electrode 11/2, and a second end of the channel part 11/4 is connected to the drain electrode 11/3. Moreover, when the TFT 11*f* is brought into an on state in accordance with a scanning signal that is supplied to the gate electrode 11/1, an image signal (signal, data signal) that is supplied to a source line 11*j* is supplied from the source electrode 11/2 to the drain electrode 11/3 and a pixel electrode 11*g* via the channel part 11/4 constituted by the semiconductor film 18, with the result that the pixel electrode 11*g* is charged to a potential based on the image signal. On the inner side of the array substrate 11*b* in the display area AA, the common electrode wire 15 is provided in addition to the components described above. The common electrode wire 15 serves to supply a reference potential signal to the common electrode 11*h* in the display area AA, and extends along the Y-axis direction. That is, the common electrode wire 15 extends in a direction parallel to the direction of extension of the source lines 11*j* and extend in a direction orthogonal to the direction of extension of the gate lines 11*i*. As will be described in detail later, in the display area AA, the common electrode wire 15 is connected to the common electrode 11*h* through a contact hole 23 bored through the inter-transparent-electrode insulating film 21. In the non-display area NAA outside the display area AA, the common electrode wire 15 is connected to a first end of a common electrode lead that is not illustrated in the present embodiment, making it possible to transmit a common potential signal that is outputted from the driver 12 to which a second end of the common electrode lead is connected.

Figure 6:
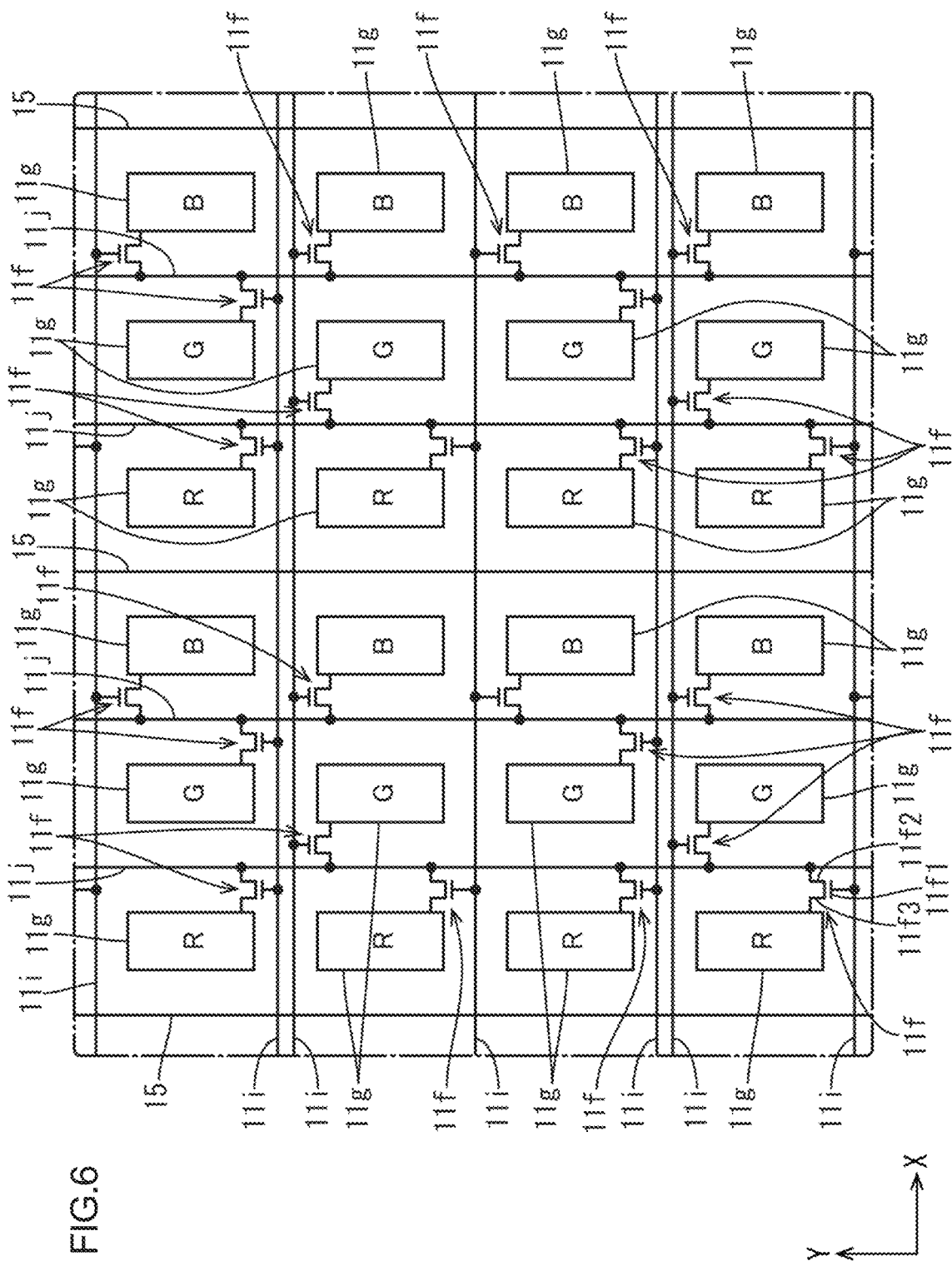
FIG. 6 is a plan view showing a circuit configuration of pixel units of the array substrate.

Next, the arrangement of the source lines 11*j* and common electrode wires 15, which are parallel to each other, in the display area AA is described. First, as shown in FIG. 6, at least two of the source lines 11*j* are placed in such a manner that a pixel electrode 11*g* is interposed between the two source lines 11*j* on both sides, respectively, of the pixel electrode 11*g* in the X-axis direction. Moreover, each of the common electrode wires 15 is placed in such a manner that a pixel electrode 11*g* that is adjacent in the X-axis direction to two source lines 11*j* between which a pixel electrode 11*g* is interposed is interposed between the common electrode wire 15 and a source line 11*j*. Each of the common electrode wires 15 is interposed between two pixel electrodes 11*g* in the X-axis direction and is therefore not adjacent to a source line 11*j* in the X-axis direction without a pixel electrode 11*g*. In particular, at least two of the common electrode wires 15 are placed in such a manner that two pixel electrodes 11*g* that are respectively adjacent to two source lines 11*j* between which a pixel electrode 11*g* is interposed in the X-axis direction are interposed between the two common electrode wires 15 and two source lines 11*j*, respectively, in the X-axis direction. More in particular, while two source lines 11*j* are placed between a pixel electrode (red pixel electrode) 11*g* constituting a pixel unit (red pixel unit) PX that exhibits red and a pixel electrode (green pixel electrode) 11*g* constituting a pixel unit (green pixel unit) PX that exhibits green and between the pixel electrode (green pixel electrode) 11*g* and a pixel electrode (blue pixel electrode) 11*g* constituting a pixel unit (blue pixel unit) PX that exhibits blue, respectively, in the X-axis direction, two common electrode wires 15 are placed in such a manner that the three pixel electrodes 11*g* and the two source lines 11*j* are collectively interposed between the two common electrode wires 15 on both sides, respectively, in the X-axis direction. It should be noted that FIG. 6 uses R, G, and B to denote the respective colors of the pixel units PX (i.e. the respective colors of color filters 11*k* that face the pixel electrodes 11*g*, respectively). In this way, the reference potential signal is supplied to the common electrode 11*h* by the common electrode wires 15 each placed in such a manner that a pixel electrode 11*g* that is adjacent to two source lines 11*j* between which a pixel electrode 11*g* is interposed is interposed between the common electrode wire 15 and a source line 11*j*; therefore, a reduction in interconnection resistance against the transmission of the reference potential signal is achieved in comparison with a conventional case where a common electrode is extended out of the display area AA (to the non-display area NAA) where the pixel electrodes 11*g* and the source lines 11*j* are placed and common electrode wires are connected to the extended portion. This keeps the reference potential of the common electrode 11*h* stable, thereby making display quality high. Moreover, since the common electrode wires 15 are disposed not to overlap the source lines 11*j*, the formation of parasitic capacitances between the common electrode wires 15 and the source lines 11*j* can be avoided. This keeps the reference potential of the common electrode 11*h* more stable, thereby making display quality higher. Furthermore, since the common electrode wires 15 each placed in such a manner that a pixel electrode 11*g* that is adjacent to two source lines 11*j* between which a pixel electrode 11*g* is interposed is interposed between the common electrode wire 15 and a source line 11*j* are disposed to avoid interposition of a source line 11*j* between the common electrode wire 15 and a pixel electrode 11*g*, the number and arrangement space of source lines 11*j* are reduced to approximately ⅔ in comparison with a case where the common electrode wires 15 are each disposed so that a source line is interposed between the common electrode wire 15 and a pixel electrode 11g. This is suitable to achieving higher definition, a narrower frame, a higher aperture ratio, and the like. Further, this achieves a reduction in cost of the driver 12, which supplies the source lines 11j with image signals, and a reduction in size of the driver 12.

The gate lines 11i, which extends along the X-axis direction orthogonal to the direction of extension of the source lines 11j and the common electrode wires 15 placed as described above, are arranged in the following manner. First, as shown in FIG. 6, a plurality of the gate lines 11i that supply the TFTs 11f with scanning signals are placed in such a manner as to be interposed between pixel electrodes 11g arranged along the Y-axis direction while extending along the X-axis direction. Moreover, the plurality of gate lines 11i include one gate electrode 11i interposed between pixel electrodes 11g arranged along the Y-axis direction and two gate lines 11i both interposed between pixel electrodes 11g arranged along the Y-axis direction and placed parallel to each other at a spacing from each other. On a side opposite to one gate line 11i in the Y-axis direction with respect to two pixel electrodes 11g between which one gate line 11i is interposed in the Y-axis direction, two gate lines 11i extending parallel to each other are placed in such a manner as to be adjacent to each other. That is, one gate line 11i and two gate lines 11i parallel to each other are repeatedly arrayed in such a manner as to be alternately arranged for every one pixel electrode 11g.

Next, how the TFTs 11f and the pixel electrodes 11g are connected to the foregoing arrangement of gate lines 11i and source lines 11j is described in detail. As shown in FIG. 6, the source lines 11j are not individually placed for each separate column of pixel electrodes 11g but, by being each connected via TFTs 11f to pixel electrodes 11g forming columns in such a manner as to be arranged along the Y-axis direction on both sides of the source line 11j, supply image signals to the pixel electrodes 11g forming the columns. More in particular, two source lines 11j between which pixel electrodes 11g are interposed are connected via TFTs 11f to all of a plurality of pixel electrodes 11g (pixel electrodes 11g belonging to a column of pixel units PX that exhibit red or blue) belonging to columns that are adjacent to each other on a side opposite to pixel electrodes 11g (pixel electrodes 11g belonging to a column of pixel units PX that exhibit green) interposed between the two source lines 11j, but are alternately connected via TFTs 11f in the Y-axis direction to a plurality of pixel electrodes 11g belonging to a column interposed between the two source lines 11j. Specifically, two source lines 11j between which pixel electrodes 11g are interposed are connected via TFTs 11f to all of a plurality of pixel electrodes 11g belonging to a column of pixel units PX that are not interposed between the two source lines 11j and that exhibit red or blue, but are intermittently connected via TFTs 11f to odd-numbered or even-numbered pixel electrodes 11g as counted from an end in the Y-axis direction from among a plurality of pixel electrodes 11g belonging to a column of pixel units PX that are interposed between the two source lines 11j and that exhibit green. According to the foregoing configuration, a plurality of pixel electrodes 11g belonging to a column of pixel units PX that are interposed between two source lines 11j and that exhibit green include an alternate arrangement in the Y-axis direction of pixel electrodes 11g that are charged to a potential based on an image signal that is supplied from either of the source lines 11j and pixel electrodes 11g that are charged to a potential based on an image signal that is supplied from the other of the source lines 11j. Accordingly, for example, in a case where the driver 12 performs column reversal driving in driving each pixel unit PX, a plurality of pixel electrodes 11g belonging to a column of pixel units PX that are interposed between two source lines 11j and that exhibit green have their polarities alternately reversed in the Y-axis direction. This makes it hard for vertical stripes of display unevenness to be viewed, leading to high display quality.

As shown in FIG. 6, different gate lines 11i are connected to TFTs 11f that are connected to a plurality of pixel electrodes 11g, included in the pixel electrodes 11g that are connected to the source lines 11j in the manner described above, that are connected to a common source line 11j and that form different columns. In this way, a plurality of TFTs 11f connected to a plurality of pixel electrodes 11g connected to a common source line 11j and forming different columns are supplied with scanning signals at different timings from different gate lines 11i, whereby the TFTs 11f are driven at different timings. This prevents a plurality of pixel electrodes 11g connected to a common source line 11j and forming different columns from being charged to a potential based on the same image signal. In particular, while two gate lines 11i interposed between pixel electrodes 11g arranged along the Y-axis direction are each selectively connected to TFTs 11f each connected to two pixel electrodes 11g, included in three pixel electrodes 11g arranged in succession along the X-axis direction, that are arranged in succession, the pixel electrodes 11g to which the TFT 11f is connected are off by one from each other. Specifically, as shown in FIG. 6, of two gate lines 11i interposed between pixel electrodes 11g arranged along the Y-axis direction, a first gate line 11i (on the upper side of FIG. 6) is connected to TFTs 11f each connected to a pixel electrode 11g belonging to a row adjacent to a side opposite to a second gate line 11i (on the lower side of FIG. 6) and constituting a pixel unit PX that exhibits red and a pixel electrode 11g adjacent to the aforementioned pixel electrode 11g and constituting a pixel unit PX that exhibits green. On the other hand, the second gate line 11i is connected to TFTs 11f each connected to a pixel electrode 11g belonging to a row adjacent to a side opposite to the first gate line 11i and constituting a pixel unit PX that exhibits green and a pixel electrode 11g adjacent to the aforementioned pixel electrode 11g and constituting a pixel unit PX that exhibits blue. Accordingly, TFTs 11f connected to pixel electrodes 11g belonging to a column interposed between two source lines 11j are all connected to two gate lines 11i interposed between pixel electrodes 11g arranged along the Y-axis direction. Meanwhile, TFTs 11f connected to a plurality of pixel electrodes 11g belonging to columns adjacent to a side opposite to pixel electrodes 11g interposed between two source lines 11j with respect to two source lines 11j between which pixel electrodes 11g are interposed are alternately connected to two gate lines 11i interposed between pixel electrodes 11g arranged along the Y-axis direction and one gate line 11i interposed between the pixel electrodes 11g arranged along the Y-axis direction. One gate line 11i interposed between the pixel electrodes 11g arranged along the Y-axis direction is connected to TFTs 11f each of which is not connected to gate lines 11i between which the pixel electrodes 11g are interposed in the Y-axis direction. Specifically, one gate line 11i interposed between the pixel electrodes 11g arranged along the Y-axis direction is connected to each TFT 11f connected to a pixel electrode 11g belonging to an upper row shown in FIG. 6 with respect to the pixel electrode 11g and constituting a pixel unit PX that exhibits red and a pixel electrode 11g belonging to a lower row shown in FIG. 6 with respect to the pixel electrode 11g and constituting a pixel unit PX that exhibits blue. Because of this, each TFTs 11f connected to a plurality of pixel electrodes 11 belonging to the same row is driven by a scanning signal that are supplied from two gate lines 11i arranged in succession in the Y-axis direction.

As shown in FIG. 4, the source lines 11j and the common electrode wires 15 both have a laminated structure of the first transparent electrode film 19 and the second metal film 20. Accordingly, in order to form the source lines 11j and the common electrode wires 15 in fabricating the array substrate 11b, it is only necessary to pattern a common first transparent electrode film 19 and a common second metal film 20 stacked in sequence at a higher level than the gate insulating film 17 and the semiconductor film 18. Note here that a reduction in manufacturing cost can be achieved because photomasks or the like needed for patterning can be reduced in comparison with a case where common electrode wires and source lines are provided by patterning different transparent electrode films and different metal films. Further, a reduction in interconnection resistance can be achieved by the source lines 11j and the common electrode wires 15 having a laminated structure of the first transparent electrode film 19 and the second metal film 20. Furthermore, a reduction in probability of broken wires can be achieved by being able to give redundancy to the source lines 11j and the common electrode wire 15. Moreover, the first transparent electrode film 19, which constitutes parts of the source lines 11j and the common electrode wire 15, also constitutes the pixel electrodes 11g; therefore, in order to form the pixel electrodes 11g in fabricating the array substrate 11b, it is only necessary to pattern the first transparent electrode film 19 shared in common with the source lines 11j and the common electrode wire 15. This makes it possible to further reduce photomasks or the like needed for patterning, thus making it possible to further reduce manufacturing cost. More specifically, the present embodiment makes it possible to pattern the pixel electrodes 11g, the source lines 11j, and the common electrode wire 15 by a single photomask (halftone mask) in fabricating the array substrate 11b, thereby being extremely suitable to achieving a reduction in manufacturing cost.

As shown in FIGS. 2 and 4, the common electrode 11h constituted by the second transparent electrode film 22 is provided with source lines overlap openings (signal line overlap openings) 24 placed in such a manner as to overlap at least parts of the source lines 11j and common electrode wire overlap openings 25 placed in such a manner as to overlap at least parts of the common electrode wire 15. The source line overlap openings 24 and the common electrode wire overlap openings 25 each extend parallel to the Y-axis direction, which is the direction of extension of the source lines 11j and the common electrode wire 15, and have a vertically long shape in plan view. By thus placing the source line overlap openings 24 in such a manner that the source line overlap openings 24 overlap at least parts of the source lines 11j, parasitic capacitances that may be formed between the source lines 11j and the common electrode 11h are reduced. Further, the state of alignment of the liquid crystal material contained in the liquid crystal layer 11c may be disrupted due to electric fields that are generated between the opening edges of the source line overlap openings 24 in the common electrode 11h and the source lines 11j. However, in the present embodiment, the liquid crystal material is a negative liquid crystal whose liquid crystal molecules are aligned in a direction perpendicular to the electric fields. Therefore, the aforementioned disruption in alignment of the liquid crystal material due to electric fields hardly occurs, and in particular, leakage of light during a black display is reduced. The source line overlap openings 24 and the common electrode wire overlap openings 25 have their length dimensions equal to the length dimensions of the pixel overlap openings 11h1 of the common electrode 11h. Moreover, the source line overlap openings 24 and the common electrode wire overlap openings 25 are arranged in alignment with each other in the Y-axis direction, and are also arranged substantially in alignment with the pixel overlap openings 11h1 in the Y-axis direction. In this way, in comparison with a case where source line overlap openings and common electrode wire overlap openings are arranged out of alignment with the pixel overlap openings 11h1 in the Y-axis direction, the source line overlap openings 24, the common electrode wire overlap openings 25, and the pixel overlap openings 11h1 are efficiently arranged and the value of electric resistance pertaining to the common electrode 11h is reduced.

Further, as shown in FIG. 2, the contact hole 23 bored through the inter-transparent-electrode insulating film 21 in order to connect the common electrode wires 15 constituted by the first transparent electrode film 19 and the second metal film 20 with the common electrode 11h constituted by the second transparent electrode film 22 is placed in such a manner as to be located between two gate lines 11i interposed between pixel electrodes 11g arranged along the Y-axis direction. In particular, the contact hole 23 is placed in such a manner as to be interposed between two gate lines 11i placed parallel to each other at a spacing from each other in the Y-axis direction. That is, the contact hole 23 is disposed with effective use of a spacing provided between two gate lines 11i in the Y-axis direction so as to be disposed at a distance from the pixel electrodes 11g, which are structures that are proactive in fulfilling a display function. Note here that since the contact hole 23 is bored through the inter-transparent-electrode insulating film 21 sandwiched between the common electrode 11h and the pixel electrodes 11g, a disruption in alignment of the liquid crystal molecules contained in the liquid crystal layer 11c tends to occur near the contact hole 23 and a display defect may occur due to the disruption in alignment of the liquid crystal molecules. In that regard, since, as mentioned above, the contact hole 23 is placed between two gate lines 11i and is disposed at a distance from the pixel electrodes 11g, which contribute to a display, a display defect attributed to the contact hole 23 hardly occurs, so that a high aperture ratio can be kept. Further, since the CF substrate 11a is provided with the light shield 11l that overlaps the gate lines 11i in plan view, a disruption in alignment that may occur in the liquid crystal molecules contained in the liquid crystal layer 11c due to the contact hole 23 hardly affects display quality.

As described above, a liquid crystal display device (display device) 10 of the present embodiment includes: a plurality of pixel electrodes 11g arranged at spacings from each other; a common electrode 11h placed in such a manner that at least part thereof overlaps the plurality of pixel electrodes 11g via an inter-transparent-electrode-film insulating film (insulating film) 21; at least two source lines (signal lines) 11j, placed in such a manner that the pixel electrodes 11g are interposed therebetween, that supply the pixel electrodes 11g with image signals; and a common electrode wire 15, placed in such a manner that the pixel electrodes 11g that are adjacent to the two source lines 11j between which the pixel electrodes 11g are interposed are interposed between the common electrode wire 15 and the source lines 11j, that extends parallel to the source lines 11j and supplies the common electrode 11h with at least a reference potential signal. In this way, while the common electrode 11h is kept at a reference potential based on the reference potential signal that is supplied by the common electrode wire 15, the pixel electrodes 11g are charged to potentials based on the image signals that are supplied by the source lines 11j. A display is done on the basis of potential differences that are generated between the common electrode 11h and the pixel electrodes 11g. The reference potential signal is supplied to the common electrode 11h by the common electrode wire 15 placed in such a manner that a pixel electrode 11g that is adjacent to two source lines 11j between which a pixel electrode 11g is interposed is interposed between the common electrode wire 15 and a source line 11j; therefore, a reduction in interconnection resistance against the transmission of the reference potential signal is achieved in comparison with a case where a common electrode is extended out of the area where the pixel electrodes 11g and the source lines 11j are placed and a common electrode wire is connected to the extended portion. This keeps the reference potential of the common electrode 11h stable, thereby making display quality high. Moreover, since the common electrode wire 15 is disposed not to overlap the source lines 11j, the formation of parasitic capacitances between the common electrode wire 15 and the source lines 11j can be avoided. This keeps the reference potential of the common electrode 11h more stable, thereby making display quality higher. Furthermore, since the common electrode wire 15 placed in such a manner that a pixel electrode 11g that is adjacent to two source lines 11j between which a pixel electrode 11g is interposed is interposed between the common electrode wire 15 and a source line 11j are disposed to avoid interposition of a source line 11j between the common electrode wire 15 and a pixel electrode 11g, the number and arrangement space of source lines 11j are reduced in comparison with a case where the common electrode wire 15 is disposed so that a source line is interposed between the common electrode wire 15 and a pixel electrode 11g. This is suitable to achieving higher definition, a narrower frame, a higher aperture ratio, and the like.

Further, the plurality of pixel electrodes 11g are arranged in rows and columns, the liquid crystal display device 10 further includes: TFTs 11f that are connected to the pixel electrodes 11g and the signal lines 11j; and gate lines 11i that supply the TFTs 11f with scanning signals, the gate lines 11i being each interposed between the pixel electrodes 11g arranged in a column-wise direction, at least two of the gate lines 11i being placed parallel to each other at a spacing from each other, and the common electrode wire 15 is connected to the common electrode 11h through a contact hole 23 bored through the inter-transparent-electrode-film insulating film 21 and located between two of the gate lines 11i that are parallel to each other. In this way, when driven on the basis of the scanning signals that are supplied by the gate lines 11i, the TFTs 11f charge the pixel electrodes 11g with potentials based on the image signals that are supplied by the source lines 11j. The contact hole 23, which connects the common electrode 11h with the common electrode wire 15, is bored through the inter-transparent-electrode insulating film 21 sandwiched between the common electrode 11h and the pixel electrodes 11g; therefore, in a case where the alignment of liquid crystal molecules is controlled by electric fields that are generated between the pixel electrodes 11g and the common electrode 11h, a disruption in alignment of the liquid crystal molecules tends to occur near the contact hole 23 and a display defect may occur due to the disruption in alignment of the liquid crystal molecules. In that regard, since, as mentioned above, the contact hole 23 is placed between two gate lines 11i that are parallel to each other and is disposed at a distance from the pixel electrodes 11g, which contribute to a display, a display defect attributed to the contact hole 23 hardly occurs, so that a high aperture ratio can be kept. Further, the common electrode 11h has source line overlap openings (signal line overlap openings) 24 placed in such a manner as to overlap at least parts of the source lines 11j. In this way, since the common electrode 11h has source line overlap openings 24 placed in such a manner as to overlap at least parts of the source lines 11j, parasitic capacitances that may be formed between the source lines 11j and the common electrode 11h are reduced. This makes display quality higher. It should be noted that electric fields are generated between the source line overlap openings 24 in the common electrode 11h and the source lines 11j; however, when a negative liquid crystal whose dielectric anisotropy is negative is used as a liquid crystal material in a case where the alignment of liquid crystal molecules is controlled by electric fields that are generated between the pixel electrodes 11g and the common electrode 11h, the liquid crystal molecules are aligned in a direction perpendicular to the electric fields. Therefore, a disruption in alignment is reduced and leakage of light during a black display is reduced, so that a decrease in contract performance is suppressed. Further, the liquid crystal display device 10 further includes a first transparent electrode film 19 that constitutes at least parts of the common electrode wire 15 and the signal lines 11j. In this way, at least parts of the common electrode wire 15 and the signal lines 11j can be provided by patterning the first transparent electrode film 19, which serves as a common conducting film. A reduction in manufacturing cost can be achieved because photomasks or the like needed for patterning can be reduced in comparison with a case where the common electrode wire 15 and the source lines 11j are provided by patterning different conducting films. Further, the liquid crystal display device 10 further includes a first transparent electrode film (transparent electrode film) 19 that constitutes the pixel electrodes 11g, and the conducting film includes at least the first transparent electrode film 19. In this way, the pixel electrodes 11g can be provided in addition to the common electrode wire 15 and the source lines 11j by patterning the common first transparent electrode film 19 included in the conducting film. As a result, a further reduction in manufacturing cost can be achieved because photomasks and the like needed for patterning can be further reduced. Further, the plurality of pixel electrodes 11g are arranged at spacings from one another in rows and columns, the liquid crystal display device 10 further includes: TFTs 11f connected to the pixel electrodes 11g and the source lines 11j; and a plurality of gate lines 11i that supply the TFTs 11f with scanning signals, the plurality of gate lines 11i being placed in such a manner as to be interposed between the pixel electrodes 11g extending along a row-wise direction and arranged in a column-wise direction, and the source lines 11j are connected via the TFTs 11f to the pixel electrodes 11g extending along the row-wise direction and forming columns on both sides thereof, while different ones of the gate lines 11i are connected to the TFTs 11f connected to the plurality of pixel electrodes 11g connected to the common signal lines 11j and forming different columns. In this way, when driven on the basis of the scanning signals that are supplied by the gate lines 11i, the TFTs 11f charge the pixel electrodes 11g with potentials based on the image signals that are supplied by the source lines 11j. The source lines 11j are not individually placed for each separate column of pixel electrodes 11g but, by being each connected via TFTs 11f to pixel electrodes 11g forming columns on both sides of the source line 11*j*, can supply image signals to the pixel electrodes 11*g* forming the columns. Meanwhile, since different gate lines 11*i* are connected to TFTs 11*f* that are connected to a plurality of pixel electrodes 11*g* connected to a common source line 11*j* and forming different columns, a plurality of TFTs 11*f* connected to a plurality of pixel electrodes 11*g* connected to a common source line 11*j* and forming different columns can be driven at different timings. This prevents a plurality of pixel electrodes 11*g* connected to a common source line 11*j* and forming different columns from being charged to a potential based on the same image signal. Further, the plurality of pixel electrodes 11*g* are arranged at spacings from one another in rows and columns, the source lines 11*j* extend along a column-wise direction, and a plurality of the pixel electrodes 11*g* interposed between two of the source lines 11*j* and forming a column include a pixel electrode that is connected to one of the adjacent source lines 11*j* and a pixel electrode that is connected to the other of the adjacent source lines 11*j*. In this way, a plurality of pixel electrodes 11*g* belonging to the same column include a pixel electrode 11*g* that is charged to a potential based on an image signal that is supplied from one of the adjacent source lines 11*j* and a pixel electrode 11*g* that is charged to a potential based on an image signal that is supplied from the other of the adjacent source lines 11*j*. Accordingly, for example, performing column reversal driving causes pixel electrodes 11*g* whose polarities have been reversed to be arranged along a column-wise direction. This makes it hard to view stripes of display unevenness, thereby achieving superior display quality.

Second Embodiment

A second embodiment of the present invention is described with reference to FIGS. 7 to 10. The second embodiment illustrates a case where a common electrode 111*h* also functions as a touch electrode 14. It should be noted that a repeated description of structures, actions, and effects which are similar to those of the first embodiment is omitted.

Figure 7:
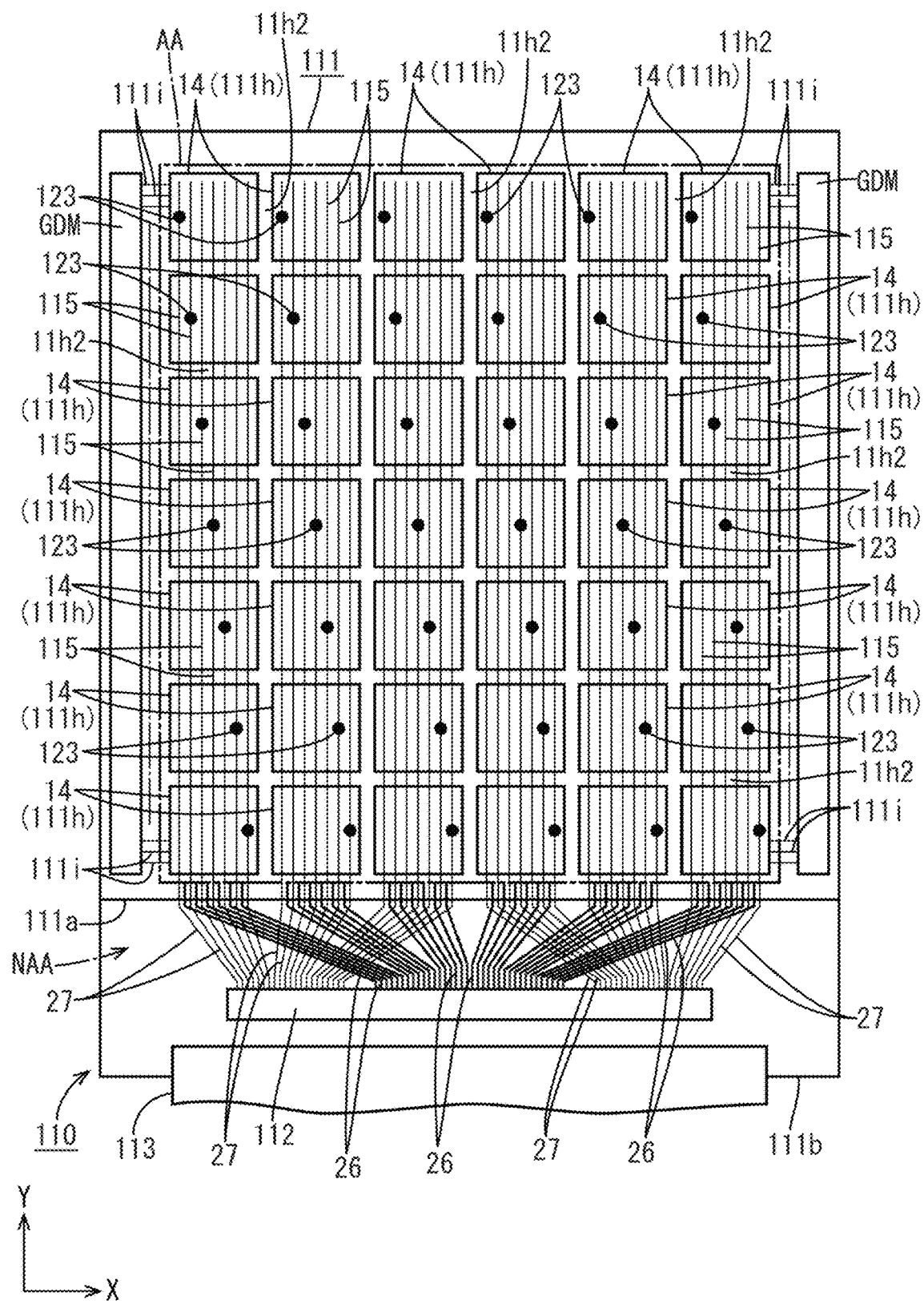
FIG. 7 is a plan view of a liquid crystal panel according to a second embodiment of the present invention.

As shown in FIG. 7, a liquid crystal panel 111 constituting a liquid crystal display device (position-input-function-equipped display device) 110 according to the present embodiment has both a display function of displaying an image and a touch panel function (position input function) of detecting a position (input position) that a user inputs on the basis of an image that is displayed, and is integrated (by in-cell technology) with a touch panel pattern for fulfilling the touch panel function. The touch panel pattern adopts a so-called projection capacitive scheme, and a detection scheme of the touch panel pattern is a self-capacitance scheme. The touch panel pattern is provided on the side of an array substrate 111*b* of a pair of substrates 111*a* and 111*b*, and is constituted by a plurality of touch electrodes (position detection electrodes) 14 placed in a matrix arrangement within a substrate plane of the array substrate 111*b*. The touch electrodes 14 are placed in the display area AA of the array substrate 111*b*. Accordingly, the display area AA in the liquid crystal panel 11 substantially corresponds to a touch area (position input area) that is capable of detecting an input position, and the non-display area NAA substantially corresponds to a non-touch area (non-position input area) that is incapable of detecting an input position. Moreover, when the user moves his/her finger (position input body; not illustrated), which is a conductor, nearer to a surface (display surface) of the liquid crystal panel 111 that he/she views, electrostatic capacitances are formed between the finger and the touch electrodes 14. As a result, an electrostatic capacitance that is detected by a touch electrode 14 located near the finger varies as the finger moves nearer and becomes different from that which is detected by a touch panel 14 located away from the finger. This makes it possible to detect an input position on the basis of that.

Figure 8:
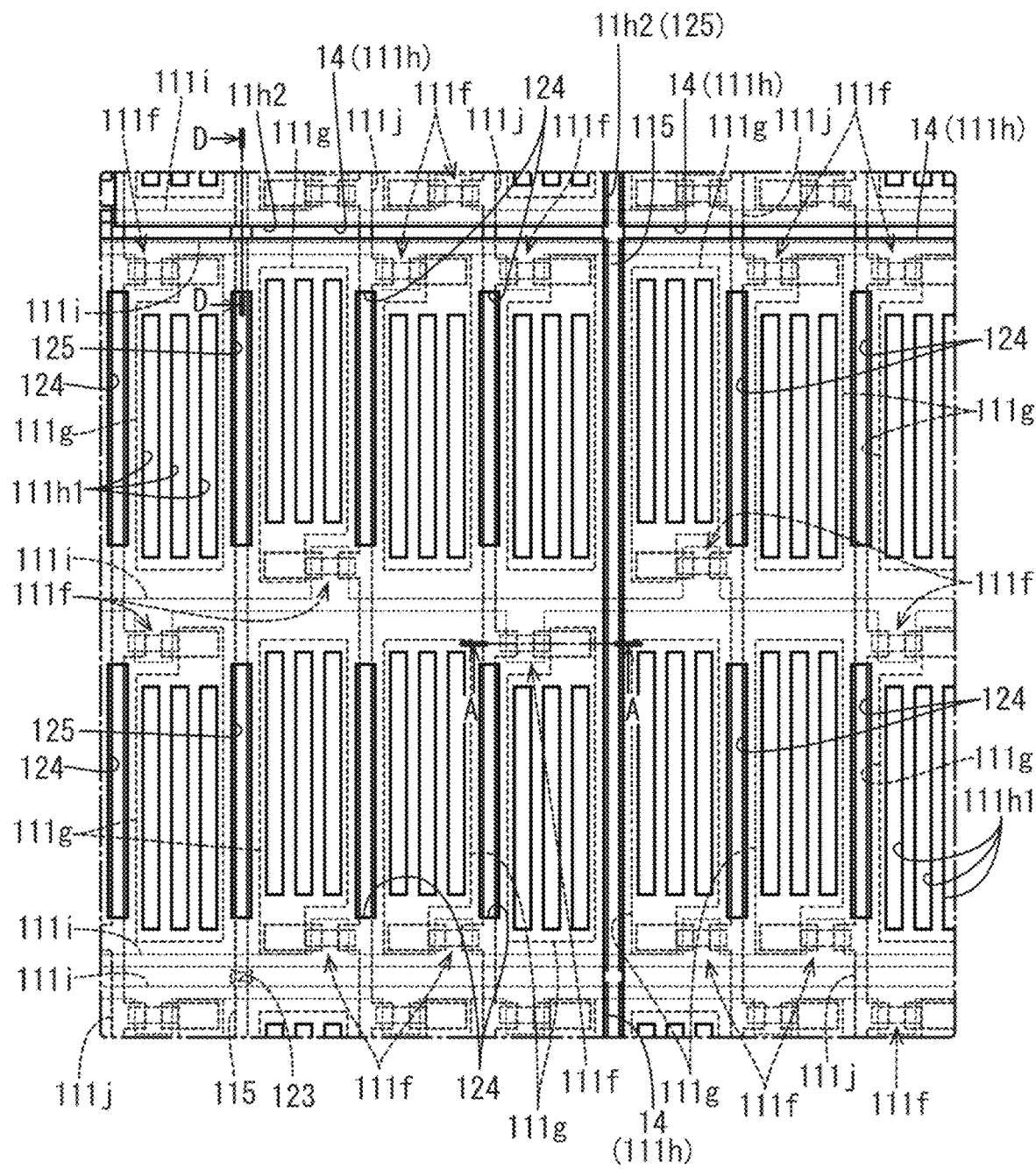
FIG. 8 is a plan view showing a pixel array of an array substrate.

Moreover, as shown in FIG. 7, these touch electrodes 14 are constituted by a common electrode 111*h* provided on the array substrate 111*b*. The common electrode 111*h* has, in addition to the already-described pixel overlap openings 111*h*1, a partition opening (partition slit) 11*h*2 that partitions adjacent touch electrodes 14 from one another. The partition opening 11*h*2 includes a portion that transverses over the entire length of the common electrode 11*h* along the X-axis direction and a portion that traverses longitudinally over the entire length of the common electrode 11*h* along the Y-axis direction, and has a substantially grid shape in plan view as a whole. The common electrode 111*h* includes a plurality of mutually electrically independent touch electrodes 14 divided into a gridiron in plan view by the partition opening 11*h*2. A plurality of the touch electrodes 14 partitioned from one another by the partition opening 11*h*2 are placed in a matrix arrangement along the X-axis direction and the Y-axis direction in the display area AA. Each of the touch electrodes 14 has a substantially square shape in plan view, is much larger than a pixel unit PX (pixel electrode 111*g*) in plan view size by measuring several millimeters (e.g. approximately 2 mm to 5 mm) on a side, and is disposed in a range across a plurality of (e.g. several tens or several hundreds of) pixel units PX in the X-axis direction and the Y-axis direction. To a plurality of touch electrodes 14, a plurality of common electrode wires 15 provided on the array substrate 111*b* are selectively connected. The common electrode wires 115 are selectively connected to particular touch electrodes 14 of a plurality of touch electrodes 14 arranged along the Y-axis direction, which is the direction of extension of the common electrode wires 115, and can be said to constitute touch wires (position detection wires). The common electrode wires 115 are connected via a driver 112 or a flexible substrate 113 to a detection circuit (not illustrated) provided outside the liquid crystal panel 111. The common electrode wires 115 supply the touch electrodes 14 (common electrode 111*h*) with reference potential signals pertaining to the display function and touch signals (position detection signals) pertaining to the touch function at different timings. Among these, the reference potential signals are transmitted to all of the common electrode wires 115 at the same timing and thereby cause all of the touch electrodes 14 to have the reference potentials to function as the common electrode 111*h*. It should be noted that FIG. 7 is a schematic representation of an array of touch electrodes 14 and the specific installation number and arrangement of touch electrodes 14 may be changed as appropriate to those which are not illustrated. The touch electrodes 14 and the common electrode wires 15 are connected to each other through contact holes 123 bored through an inter-transparent-electrode-film insulating film 121, and are identical in coupling structure to the common electrode 11*h* and the common electrode wire 15, which are described in the first embodiment (see FIG. 5). As shown in FIG. 8, the common electrode wires 115 extend substantially along the Y-axis direction in such a manner transverse all of the touch electrodes 14, but are selectively connected to only particular touch electrodes 14 by a planar arrangement of contact holes 123. Accordingly, the common electrode wires 115 to be connected and the common electrode wires 115 not to be connected are disposed to overlap the touch electrodes 14 via the inter-transparent-electrode-film insulating film 121.

Figure 9:
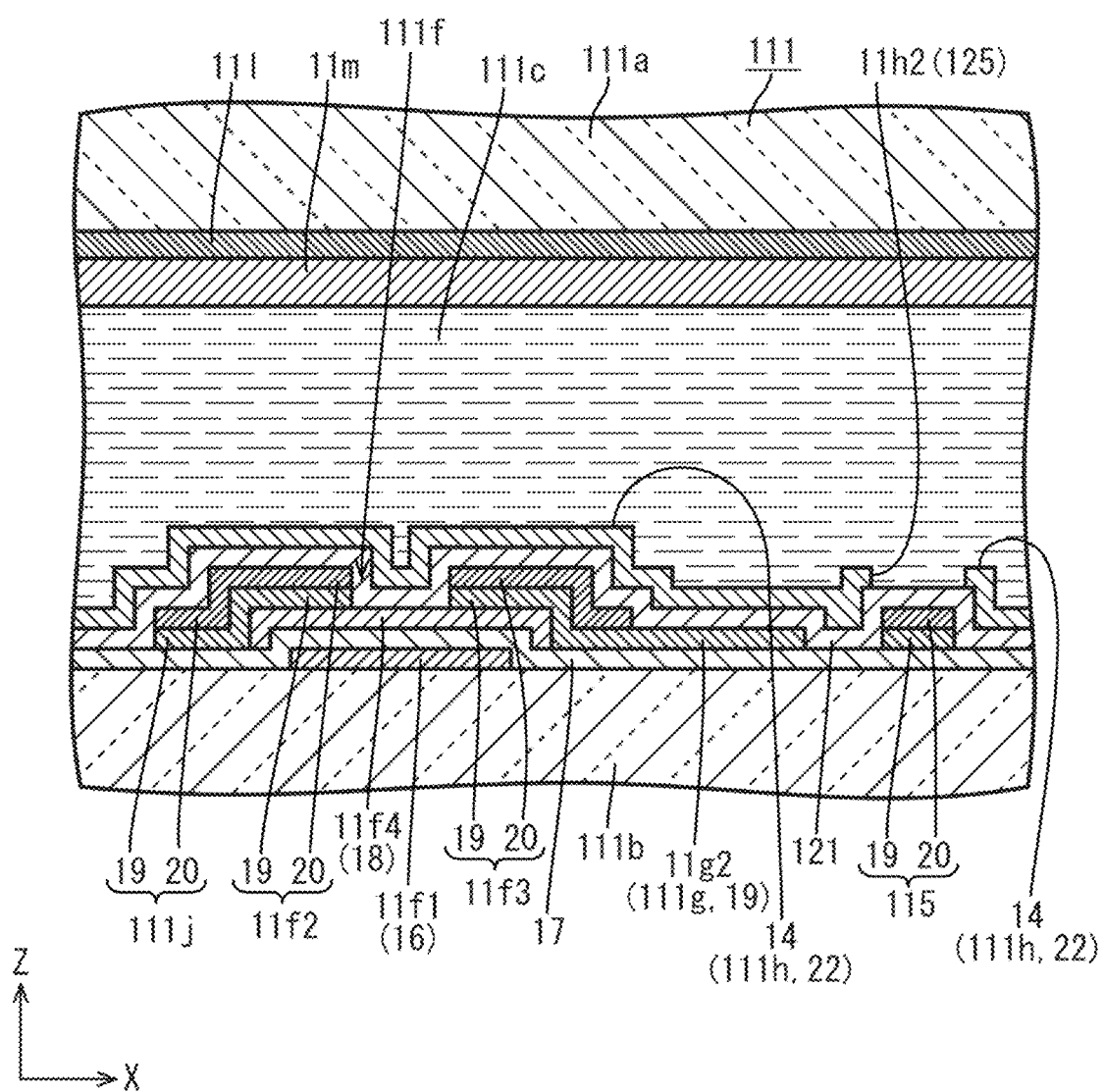
FIG. 9 is a cross-sectional view taken along line A-A in FIG. 8.

As shown in FIGS. 8 and 9, parts of the partition opening 11h2, which partitions adjacent touch electrodes 14 from one another, in the common electrode 11h are placed in such a manner as to overlap source lines 111j and the common electrode wires 115, and also function as at least either source line overlap openings 124 or common electrode wire overlap openings 125. Although FIGS. 8 and 9 representatively illustrates a case where parts of the partition opening 11h2 overlap the common electrode wires 115 and constitute the common electrode wire overlap openings 125, parts of the partition opening 11h2 may include those which overlap the source lines 111j and constitute the source line overlap openings 124. Portions of the partition opening 11h2 that constitute the source line overlap openings 124 and the common electrode wire overlap openings 125 extend over the entire length of the display area AA in the Y-axis direction and therefore overlap the source lines 111j and the common electrode wires 115 over substantially the entire length of the source lines 111j and the common electrode wires 115. In this way, the partition opening 112, which is an existing structure, can be utilized to reduce parasitic capacitances that may be formed between the source lines 111j and the touch electrodes 14 and parasitic capacitances that may be formed between the common electrode wires 115 and touch electrodes 14 that are not connected to the common electrode wires 115. Further, a higher aperture ratio is achieved than in a case where a partition opening is disposed not to overlap the source lines 111j or the common electrode wires 115 and to overlap pixel electrodes 111g. Preferably, in the present embodiment, parts of the partition opening 11h2 selectively overlap the common electrode wires 115 and do not overlap the source lines 111j. Note here that if parts of a partition opening are placed in such a manner as to overlap at least parts of the source lines 111j, the partition opening, whose installation intervals are much wider than installation intervals between the source lines 111j, is not disposed to overlap all of the large number of source lines 111j; therefore, some of the large number of source lines 111j do not overlap the partition opening, with the result that a load of each source line 111j may become uneven. In that regard, when, as described above, parts of the partition opening 11h2 are placed in such a manner as to selectively overlap some of the large number of common electrode wires 115 and do not overlap any of the source lines 111j, loads of the large number of source lines 111j can be kept uniform, whereby a display defect such as luminance unevenness can be reduced.

Figure 10:
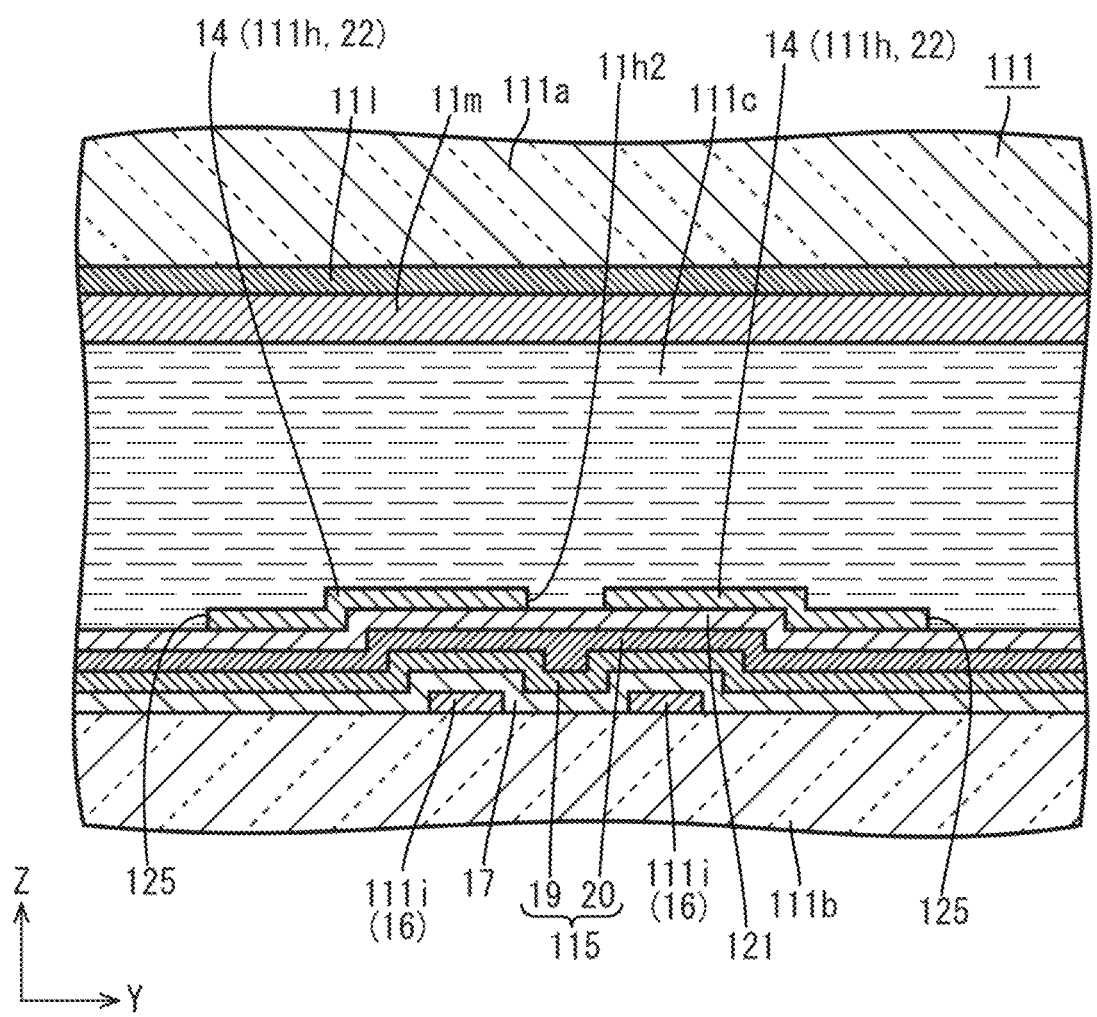
FIG. 10 is a cross-sectional view taken along line D-D in FIG. 8.

Further, as shown in FIGS. 8 and 10, the common electrode 111h is placed in such a manner that a part of the partition opening 11h2 is located between two gate lines 111i interposed between pixel electrodes 111g arranged along the Y-axis direction. That is, a portion of the partition opening 11h2 that extends along the X-axis direction is disposed not to overlap the pixel electrodes 111g or each gate line 111i by being disposed with effective use of a space between two gate lines 111i placed parallel to each other at a spacing from each other in the Y-axis direction. Accordingly, a higher aperture ratio can be kept than in a case where a partition opening is disposed to overlap the pixel electrodes 111g, and in comparison with a case where a partition opening is disposed to overlap either of the gate lines 111j and not to overlap the other gate line 111j, parasitic capacitances that are formed between the gate lines 111i and the common electrode 111h (touch electrodes 14) are suitably equalized. Furthermore, since electric fields that are generated between the gate lines 111j and the common electrode 111h can be shielded by the common electrode 111h per se, a disruption in alignment of the liquid crystal molecules contained in a liquid crystal layer 111c hardly occurs. Further, as shown in FIG. 7, the source lines 111j and the common electrode wires 115, which are placed in the display area AA of the array substrate 111b, are connected to source leads (signal leads) 26 and common electrode leads 27 that are placed in the non-display area NAA, respectively. It should be noted that FIG. 7 omits to illustrate the source lines 111j. A large number of the source leads 26 and a large number of the common electrode leads 27 are placed at spacings from each other along the X-axis direction as is the case with the source lines 111j and the common electrode wires 115, have their first ends connected to ends of the source lines 111j and the common electrode wires 115, respectively, and have their second ends routed in substantially fan-like fashion toward a mounting region of the driver 112, and at those lead tips, terminals areas (not illustrated) that are connected to the driver 112 are provided, respectively. While the large number of source leads 26 have their second ends converging on a central side of the driver 112 in alongside direction (X-axis direction), the large number of common electrode leads 27 have their second ends converging into two groups at both ends of the driver 112 in the long side direction. On the central side of the driver 112 in the long side direction, a circuit for outputting image signals to the source leads 26 is provided, and at both ends of the driver 112 in the long side direction, circuits for outputting touch signals to the common electrode leads 27 are provided, respectively. For distinction, FIG. 8 uses thick solid lines to illustrate the source leads 26 and uses thin solid lines to illustrate the common electrode leads 27.

As described above, the liquid crystal display device 110 according to the present embodiment further includes a touch electrode (position detection electrode) 14, obtained by dividing the common electrode 111h, which forms an electrostatic capacitance with a finger serving as a position input body that performs position input and which detects an input position inputted by the finger serving as the position input body, and the common electrode wire 115 supplies the touch electrode 14 with a position detection signal. In this way, the touch electrode 14 can form an electrostatic capacitance with a finger serving as the position input body that performs position input and, by utilizing the position detection signal that is supplied by the common electrode wire 115, detect an input position inputted by the finger serving as the position input body. Since the common electrode wire 115 is capable of transmitting a reference potential signal and a position detection signal, a higher aperture ratio is suitably achieved in comparison with a case where a wire that transmits a position detection signal is provided separately from the common electrode wire 115. Further, the common electrode 111h has a plurality of the touch electrodes 14 and a partition opening 11h2 partitioning adjacent ones of the touch electrodes 14 from one another and placed in such a manner as to overlap at least part of the common electrode wire 115. In this way, the common electrode 111h makes it possible to reduce parasitic capacitances that may be formed between the common electrode wire 115 and the touch electrodes 14, as the partition opening 11h2 partitioning adjacent ones of the touch electrodes 14 from one another is placed in such a manner as to overlap at least part of the common electrode wire 115. This makes it possible to reduce parasitic capacitances by utilizing the partition opening 11h2, which is an existing structure. A higher aperture ratio can be kept than in a case where a partition opening is disposed not to overlap the common electrode wire 115 and to overlap pixel electrodes 111g. Furthermore, if a partition opening is placed in such a manner as to overlap at least parts of the source wires 111j, the partition opening 11h2 is not disposed to overlap all of at least two source lines 111j; therefore, some of the at least two source lines 111j do not overlap the partition opening 11h2, with the result that a load of each source line 111j may become uneven. In that regard, since, as described above, the partition opening 11h2 is placed in such a manner as to overlap at least part of the common electrode wire 115, loads of the at least two source lines 111j can be kept uniform, whereby a display defect such as luminance unevenness can be reduced. Further, the plurality of pixel electrodes 111g are arranged in rows and columns, the liquid crystal display device 110 further includes: TFTs (switching elements) 111f connected to the pixel electrodes 111g and the source lines 111j; and gate lines (scanning lines) 111i that supply the TFTs 111f with scanning signals, the gate lines 111i being each interposed between the pixel electrodes 111g arranged in a column-wise direction, at least two of the gate lines 111i being placed parallel to each other at a spacing from each other, and the common electrode 111h has a plurality of the touch electrodes 14 and a partition opening 11h2 partitioning adjacent ones of the touch electrodes 14 from one another and placed in such a manner as to be interposed between at least two of the gate lines 111i. In this way, when driven on the basis of the scanning signals that are supplied by the gate lines 111i, the TFTs 111f charge the pixel electrodes 11g with potentials based on the image signals that are supplied by the source lines 111j. In the common electrode 111h, the partition opening 11h2 partitioning adjacent ones of the touch electrodes 14 from one another is placed in such a manner as to be interposed between at least two gate lines 111i both interposed between pixel electrodes 111g arranged in a column-wise direction and placed parallel to each other at a spacing from each other. A higher aperture ratio can be kept than in a case where a partition opening is disposed not to overlap the gate lines 111i and to overlap the pixel electrodes 111g. Further, in comparison with a case where a partition opening is disposed to overlap either of the gate lines 111i and not to overlap the other gate line 111i, parasitic capacitances that are formed between the at least two gate lines 111i and the common electrode 111h are suitably equalized. Furthermore, since electric fields that are generated between the gate lines 111i and the common electrode 111h can be shielded by the common electrode 111h per se, a disruption in alignment of the liquid crystal molecules hardly occurs in a case where the alignment of the liquid crystal molecules is controlled by electric fields that are generated between the pixel electrodes 111g and the common electrode 111h.

Third Embodiment

A third embodiment of the present invention is described with reference to FIGS. 11 to 14. The third embodiment illustrates the addition of an interlayer insulating film 28 to the configuration described in the second embodiment. It should be noted that a repeated description of structures, actions, and effects which are similar to those of the second embodiment is omitted.

Figure 12:
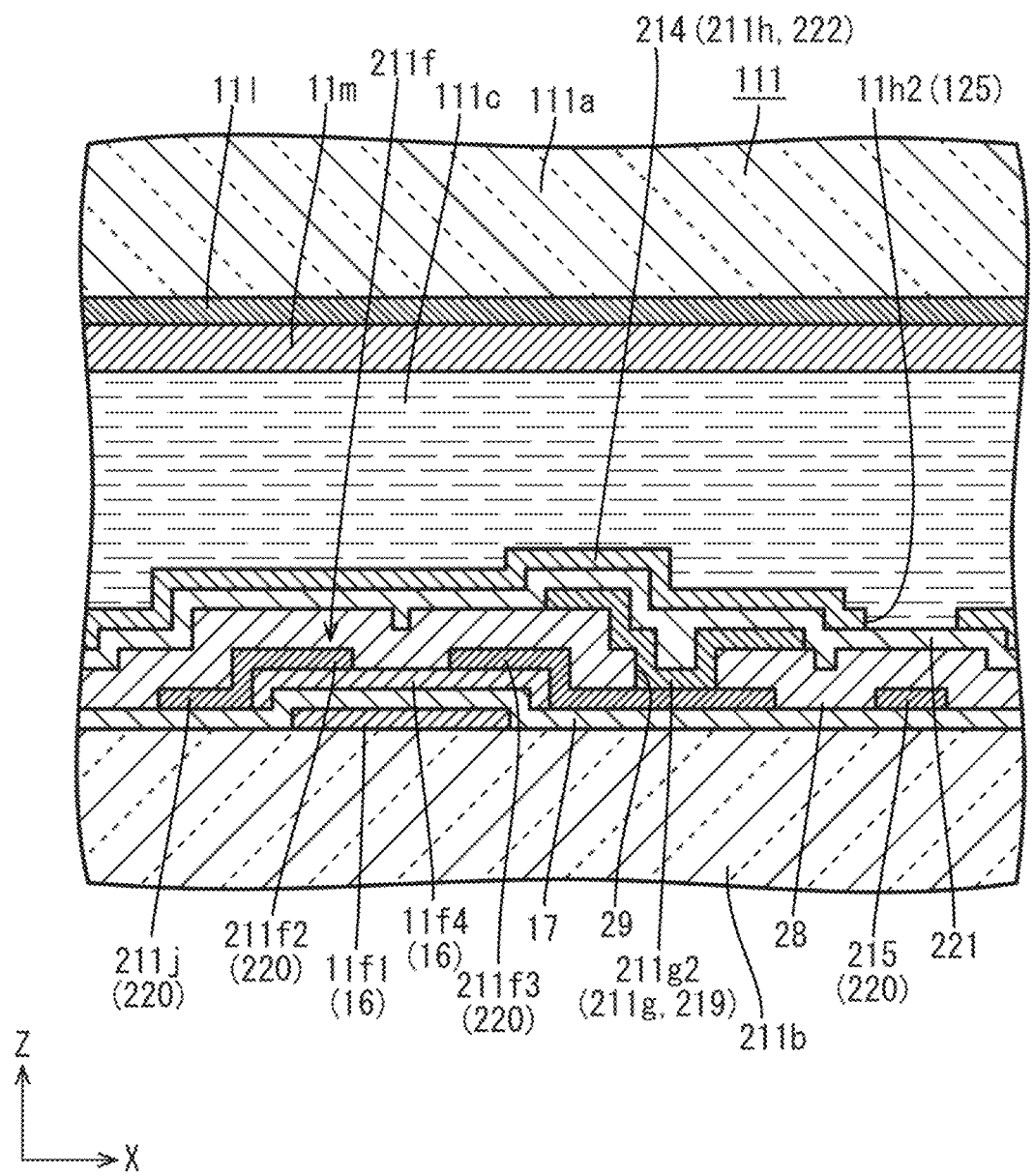
FIG. 12 is a cross-sectional view taken along line A-A in FIG. 11.
Figure 13:
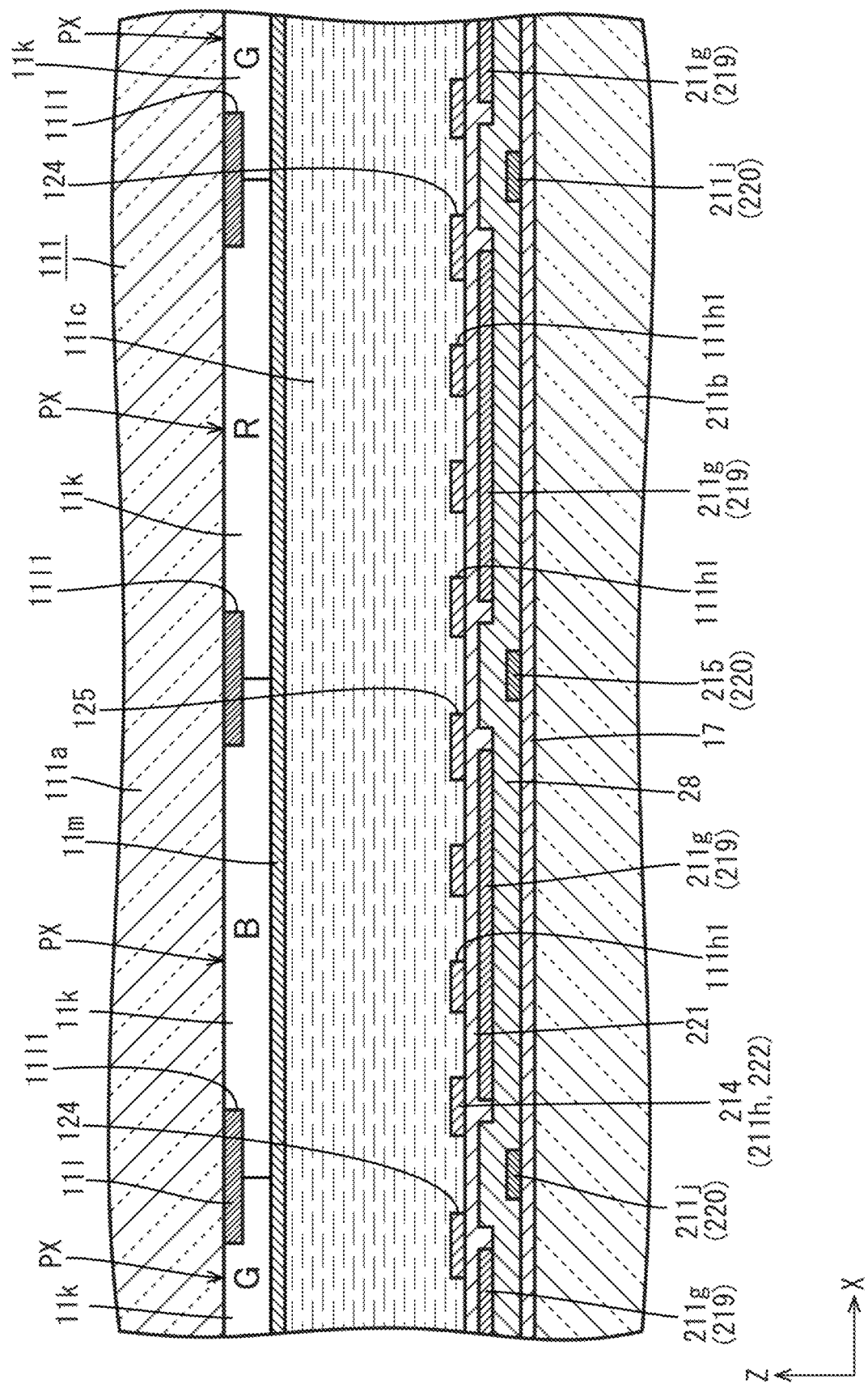
FIG. 13 is a cross-sectional view taken along line B-B in FIG. 11.
Figure 14:
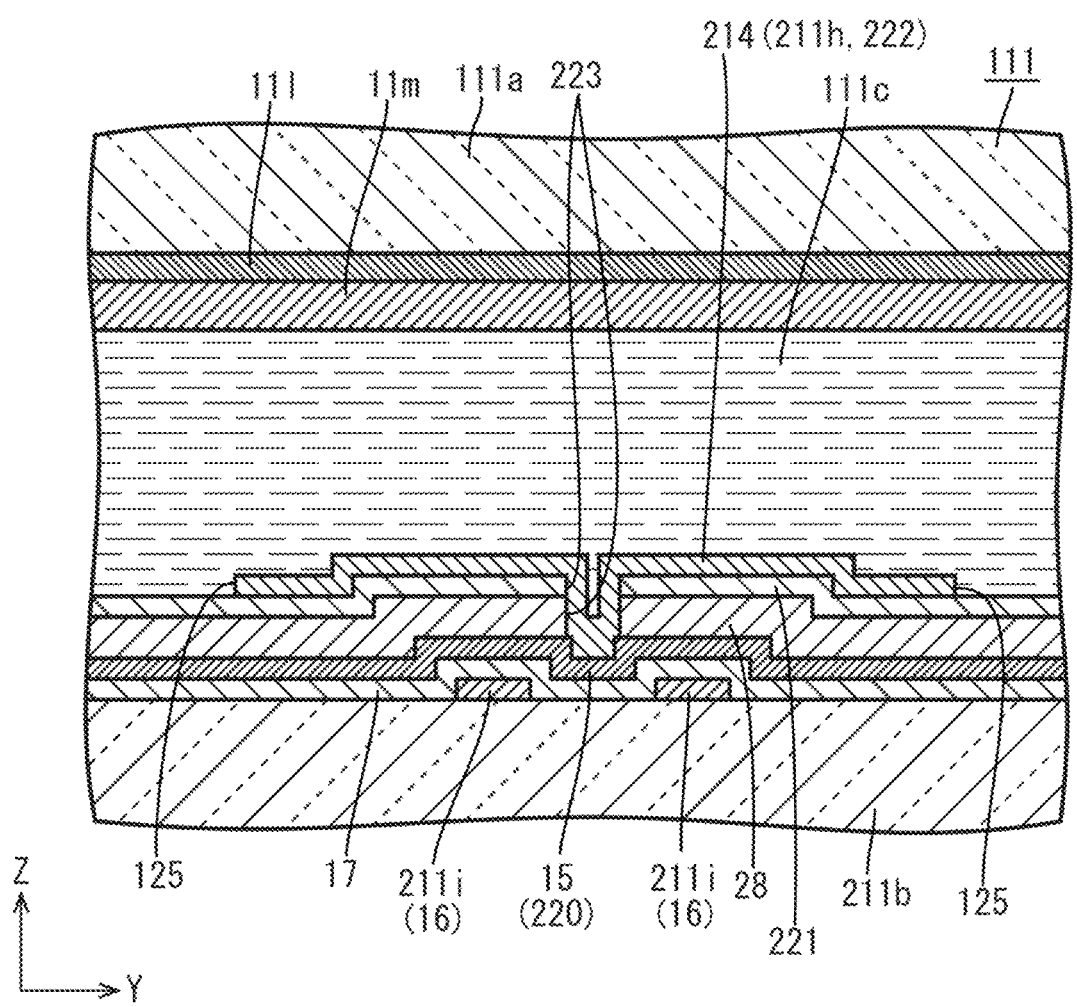
FIG. 14 is a cross-sectional view taken along line C-C in FIG. 11.

As shown in FIGS. 12 and 13, an array substrate 211b according to the present embodiment is provided with an interlayer insulating film 28 sandwiched between a first transparent electrode film 219 and a second metal film 220. As is the case with an inter-transparent-electrode-film insulating film 221, the interlayer insulating film 28 is made of an inorganic material and keeps the first transparent electrode film 219 and the second metal film 220 insulated from each other. While the first transparent electrode film 219 is placed at a higher level than the interlayer insulating film 28, the second metal film 220 is placed at a lower level than the interlayer insulating film 28. Accordingly, in the present embodiment, source lines 211j and a common electrode wire 215 are constituted solely by the second metal film 220. Accordingly, the interlayer insulating film 28 is sandwiched between the source lines 211j and the common electrode wire 215, which are constituted by the second metal film 220, and a pixel electrode 211g constituted by the first transparent electrode film 219. Furthermore, the interlayer insulating film 28 and the inter-transparent-electrode-film insulating film 221 are sandwiched between the source lines 211j and the common electrode wire 215, which are constituted by the second metal film 220, and a touch electrode 214 (common electrode 211h) constituted by a second transparent electrode film 222. As a result, the distance between the source lines 211j and the touch electrode 214 and between the common electrode wire 215 and the touch electrode 214 becomes greater by the film thickness of the interlayer insulating film 28 than in the second embodiment, so that parasitic capacitances that may be formed between the source lines 211j and the touch electrode 214 and between the common electrode wire 215 and the touch electrode 214 are reduced. This makes position detection sensitivity and display quality higher. Further, as shown in FIG. 14, a contact hole 233 for connecting the touch electrode 214 with the common electrode wire 215 is bored in such a manner as to communicate with the inter-transparent-electrode-film insulating film 221 and the interlayer insulating film 28.

Figure 11:
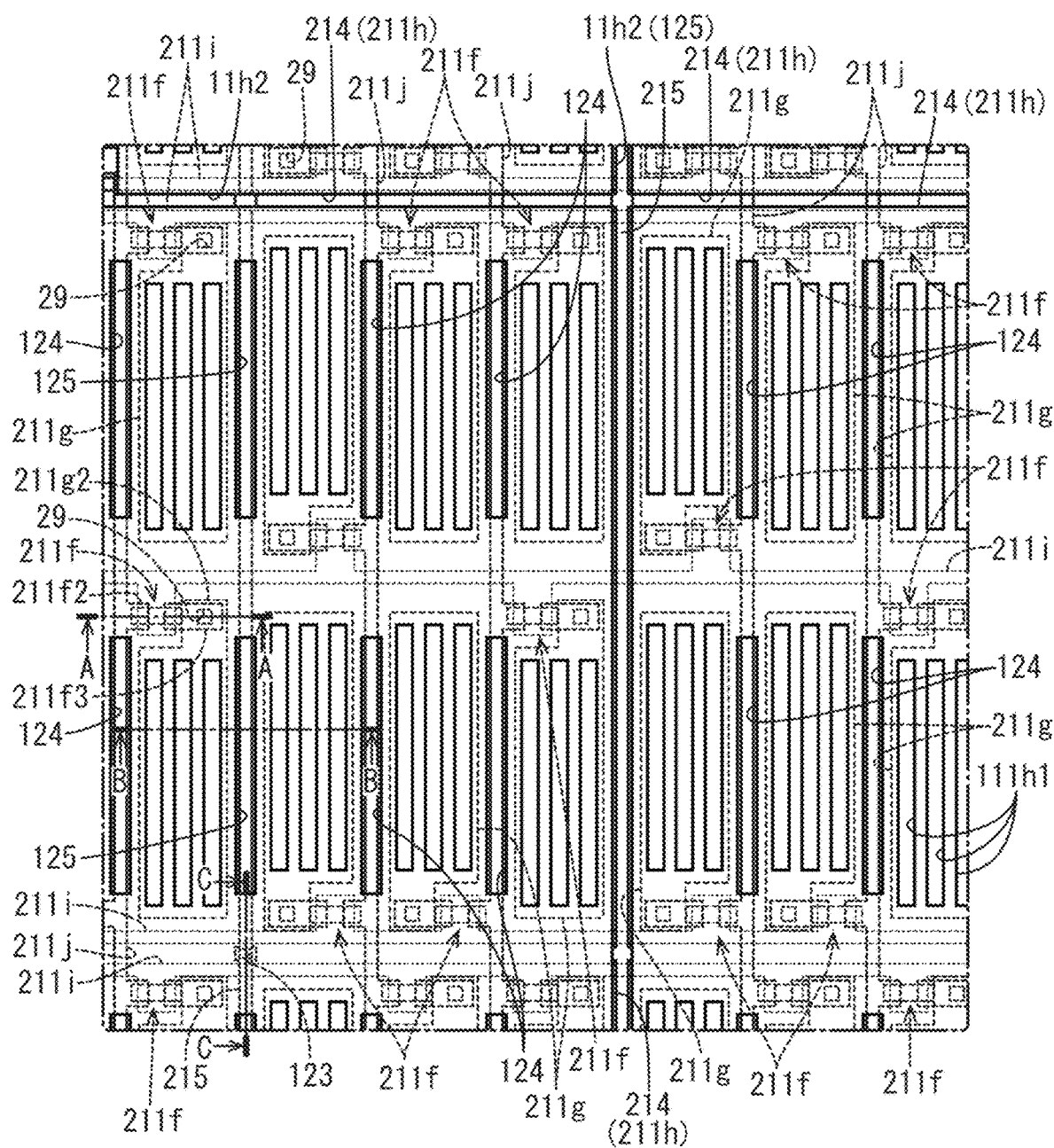
FIG. 11 is a plan view showing a pixel array of an array substrate constituting a liquid crystal panel according to a third embodiment of the present invention.

In the present embodiment, as shown in FIGS. 12 and 13, the inter-transparent-electrode-film insulating film 221 is smaller in film thickness than the interlayer insulating film 28. This makes the spacing between the pixel electrode 211g and the common electrode 211h smaller and therefore makes stronger an electric field (particularly an electric field in a horizontal direction to a substrate of a transverse electric field mode liquid crystal display device) that is generated between the two electrodes 211g and 211h, thereby making display quality higher. Meanwhile, the interlayer insulating film 28, which is larger in film thickness than the inter-transparent-electrode-film insulating film 221, makes the spacings between the source lines 211j and the touch electrode 214 and between the common electrode wire 215 and the touch electrode 214 larger, thereby further reducing parasitic capacitances that may be formed between the source lines 211j and the touch electrode 214 (common electrode 211h) and between the common electrode wire 215 and the touch electrode 214. This makes position detection sensitivity and display quality even higher. Further, a source line 211f2 and a drain electrode 211f3 that constitute a TFT 211f are constituted solely by the second metal film 220 as is the case with the source lines 211j and the common electrode wire 215. Accordingly, as shown in FIGS. 11 and 12, the drain electrode 211f3 is connected to a contact portion 211g2 of the pixel electrode 211g, which is constituted by the first transparent electrode film 219, through a pixel contact hole 29 bored through the interlayer insulating film 28. The pixel contact hole 29 is planarly disposed in a position of overlap between the drain electrode 211f3 of each TFT 211f and the contact portion 211g2 of each pixel electrode 211g.

As described above, a liquid crystal display device according to the present embodiment further includes: a first transparent electrode film 219; a second transparent electrode film 222, the first transparent electrode film 219 constituting the pixel electrodes 211g when the second transparent electrode film 222 constitutes the common electrode 211h, the first transparent electrode film 219 constituting the common electrode 211h when the second transparent electrode film 222 constitutes the pixel electrodes 211g, the inter-transparent-electrode-film insulating film 221 being sandwiched between the first transparent electrode film 219 and the second transparent electrode film 222; and a second metal film (metal film) 220 placed on a side of the first transparent electrode film 219 opposite to the second transparent electrode film 222 with an interlayer insulating film 28 sandwiched between the first transparent electrode film 219 and the second metal film 220, and the conducting film includes at least the second metal film 220. In this way, the distances between the common electrode wire 215 and the common electrode 211h and between the source lines 211j and the common electrode 211h become greater by the interlayer insulating film 28 than in a case where the conducting film is configured to include the first transparent electrode film 219. This reduces parasitic capacitances that may be formed between the common electrode wire 215 and the common electrode 211h and between the source lines 211j and the common electrode 211h, thereby making display quality higher. Further, since the distance between the gate lines 211i and the touch electrode 214 becomes greater by the interlayer insulating film 28, parasitic capacitances that may be formed between the gate lines 211i and the touch electrode 14 are reduced. Further, the inter-transparent-electrode-film insulating film 221 is smaller in film thickness than the interlayer insulating film 28. This makes the spacing between the pixel electrode 211g and the common electrode 211h smaller and therefore makes stronger an electric field (particularly an electric field in a horizontal direction to a substrate of a transverse electric field mode liquid crystal display device) that is generated between the two electrodes 211g and 211h, thereby making display quality higher. Meanwhile, the interlayer insulating film 28, which is larger in film thickness than the inter-transparent-electrode-film insulating film 221, makes the spacings between the common electrode wire 215 and the common electrode 211h and between the source lines 211j and the common electrode 211h larger, thereby further reducing parasitic capacitances that may be formed between the common electrode wire 215 and the common electrode 211h and between the source lines 211j and the common electrode 211h. This makes display quality even higher.

Fourth Embodiment

A fourth embodiment of the present invention is described with reference to FIGS. 15 to 16. The fourth embodiment illustrates a change in placement of a common electrode wire 315 from the third embodiment and the addition of a third metal layer 30 to the third embodiment. It should be noted that a repeated description of structures, actions, and effects which are similar to those of the third embodiment is omitted.

Figure 15:
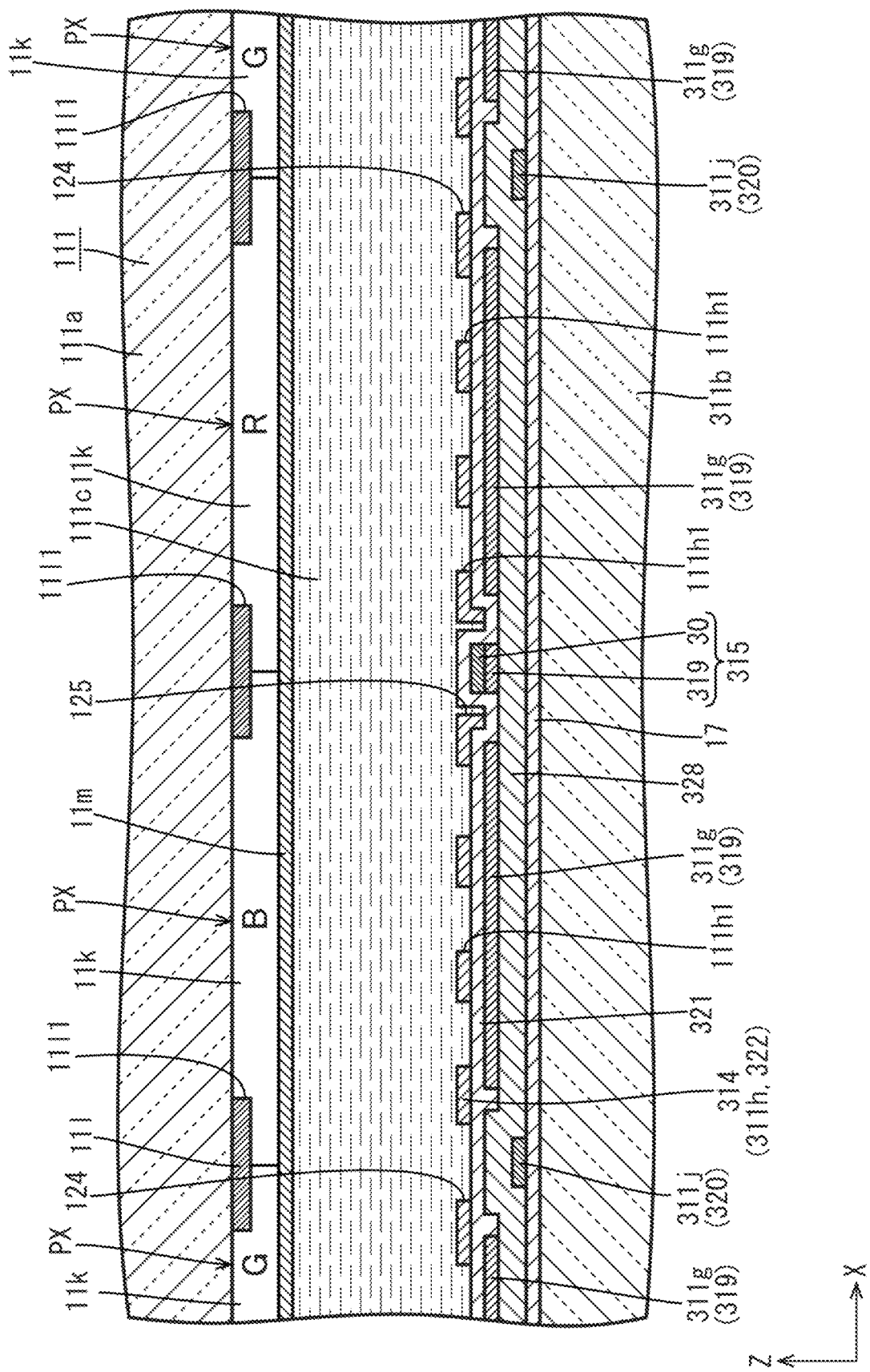
FIG. 15 is a cross-sectional view of a pixel unit of a liquid crystal panel according to a fourth embodiment of the present invention as taken along a line near the centers of pixel units.
Figure 16:
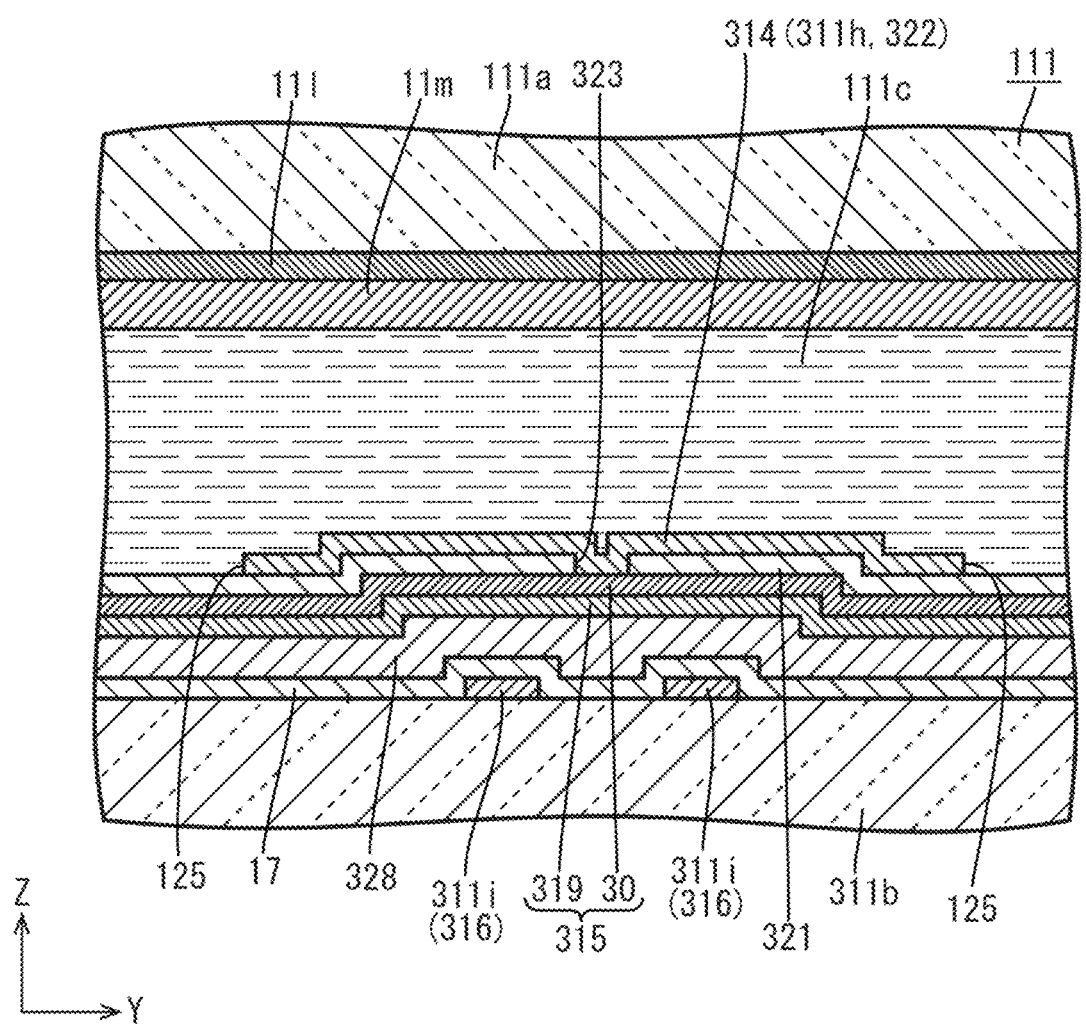
FIG. 16 is a cross-sectional view of a place of connection between a common electrode and a common electrode wire.

As shown in FIG. 15, an array substrate 311b according to the present embodiment is provided with a third metal film 30 sandwiched between a first transparent electrode film 319 and an inter-transparent-electrode-film insulating film 321. As is the case with a first metal film 316 and a second metal film 320, the third metal film 30 has electric conductive properties and light-blocking properties by being a single-layer film made of one type of metal material or an alloy or laminated film made of different types of metal material. Moreover, the common electrode wire 315 is a laminated structure of the first transparent electrode film 319 and the third metal layer 30. That is, the common electrode wire 315, which is placed at a higher level than an interlayer insulating film 328, is disposed at the same level as pixel electrodes 311g constituted by the first transparent electrode film 319 but is disposed at a higher level than source lines 311j constituted by the second metal film 320 via the interlayer insulating film 328. Accordingly, the spacing between the source lines 311j and a touch electrode 314 (common electrode 311h) is larger by the film thickness of the interlayer insulating film 328 than in a case described in the first embodiment where the source lines 11j and the common electrode wire 15 are disposed at the same level. This reduces parasitic capacitances that may be formed between the source lines 311j and the touch electrode 314, thereby making position detection sensitivity and display quality higher. Further, as shown in FIG. 16, a contact hole 323 for connecting the touch electrode 314 with the common electrode wire 315 is bored only through the inter-transparent-electrode-film insulating film 321.

As described above, a liquid crystal display device according to the present embodiment further includes: a first transparent electrode film 319; a second transparent electrode film 322, the first transparent electrode film 319 constituting the pixel electrodes 311g when the second transparent electrode film 322 constitutes the common electrode 311h, the first transparent electrode film 319 constituting the common electrode 311h when the second transparent electrode film 322 constitutes the pixel electrodes 311g, the inter-transparent-electrode-film insulating film 321 being sandwiched between the first transparent electrode film 319 and the second transparent electrode film 322; and a second metal film 320 placed on a side of the first transparent electrode film 319 opposite to the second transparent electrode film 322 with an interlayer insulating film 328 sandwiched between the first transparent electrode film 319 and the second metal film 320, and while the first transparent electrode film 319 constitutes at least part of the common electrode wire 315, the second metal film 320 constitutes at least parts of the source lines 311j. In this way, the spacing between the source lines 311j and the common electrode 311h becomes larger by the interlayer insulating film 328 than in a case where a first transparent electrode film constitutes at least parts of the source lines 311j in addition to the common electrode wire 315. This reduces parasitic capacitances that may be formed between the source lines 311j and the common electrode 311h, thereby making display quality higher. Further, since the distance between the gate lines 311i and the touch electrode 314 becomes greater by the interlayer insulating film 328, parasitic capacitances that may be formed between the gate lines 311i and the touch electrode 314 are reduced.

Fifth Embodiment

A fifth embodiment of the present invention is described with reference to FIG. 17 or 18. The fifth embodiment illustrates a change in configuration of a common electrode wire 415 from the fourth embodiment. It should be noted that a repeated description of structures, actions, and effects which are similar to those of the fourth embodiment is omitted.

Figure 17:
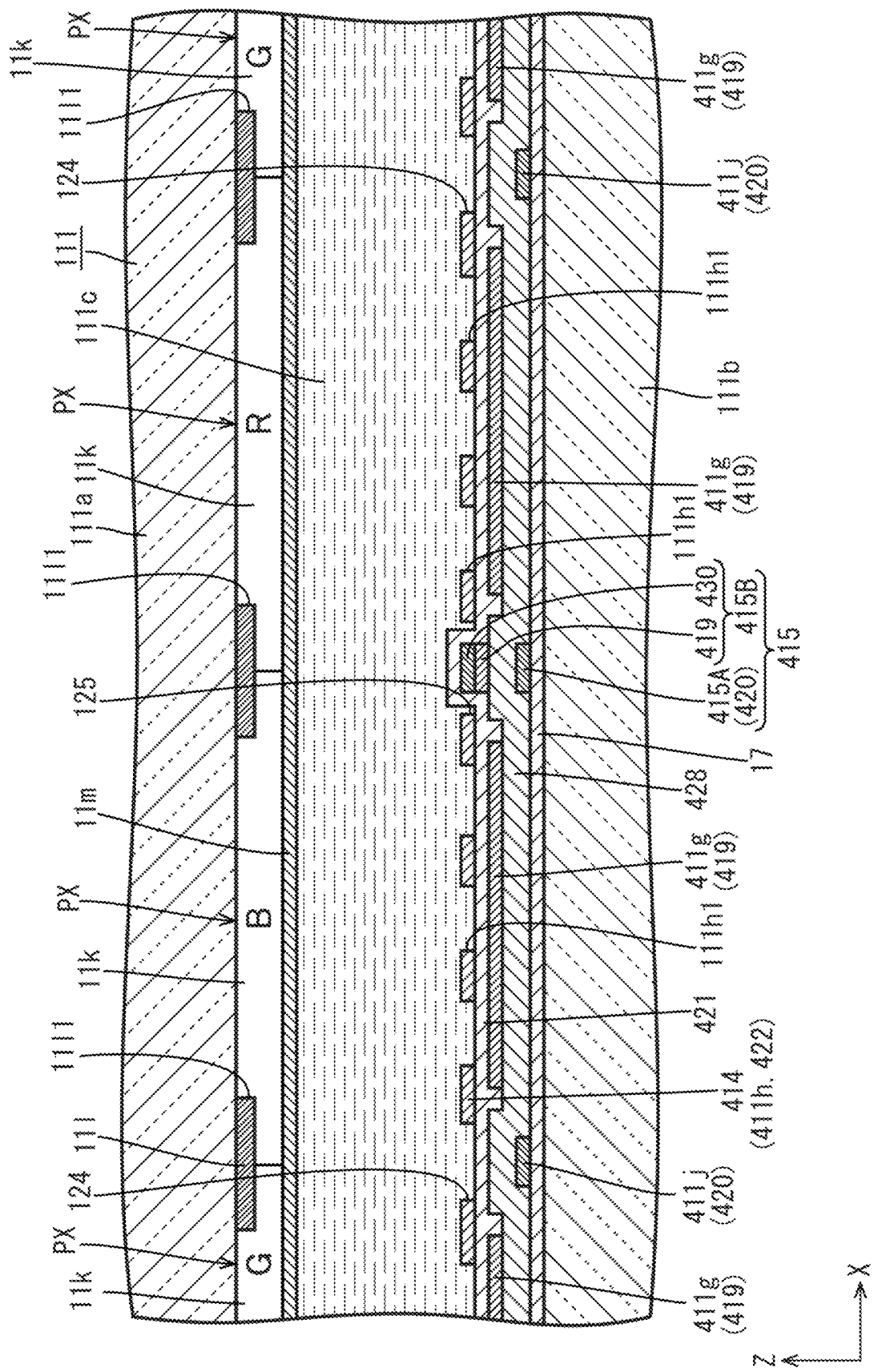
FIG. 17 is a cross-sectional view of a pixel unit of a liquid crystal panel according to a fifth embodiment of the present invention as taken along a line near the centers of pixel units.
Figure 18:
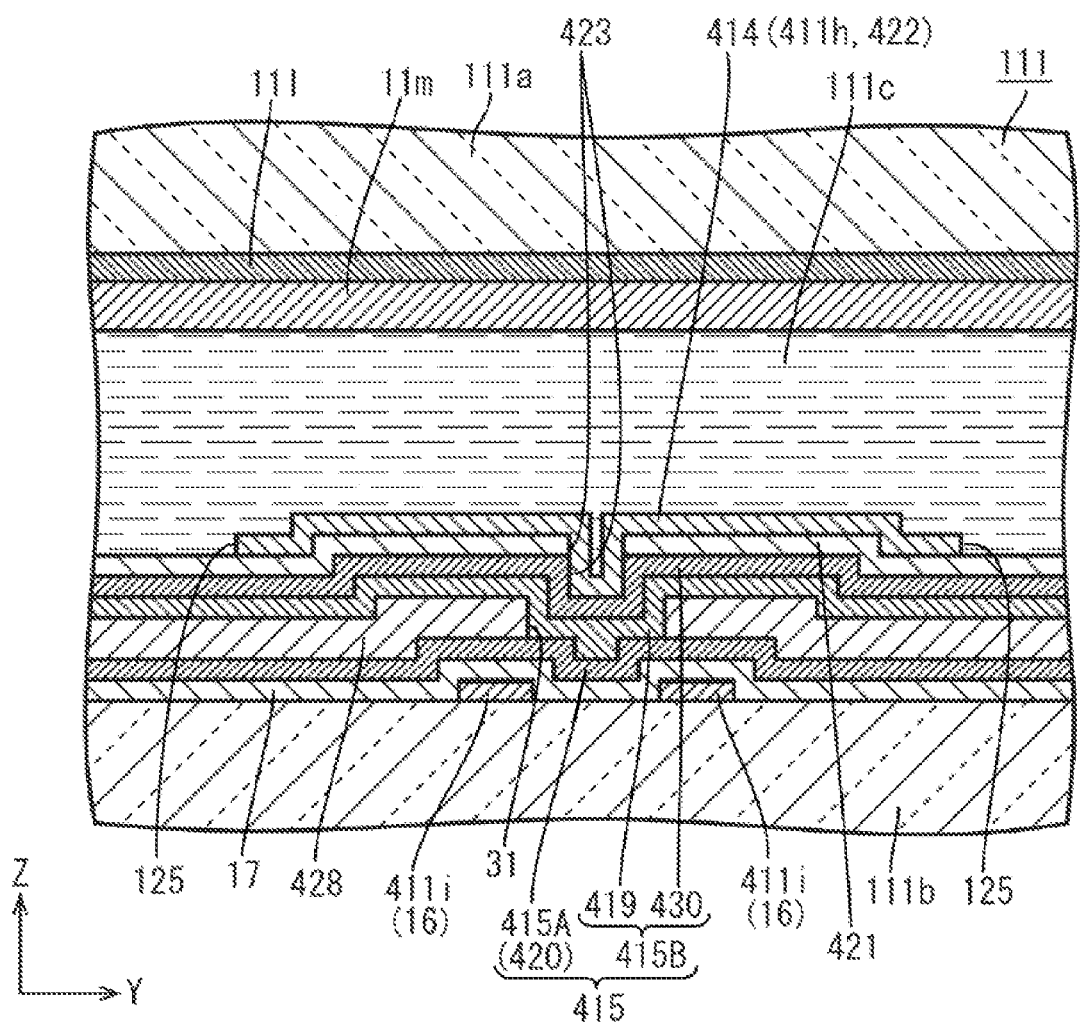
FIG. 18 is a cross-sectional view of a place of connection between a common electrode and a common electrode wire.

As shown in FIGS. 17 and 18, the common electrode wire 415 according to the present embodiment includes a first common electrode wire 415A constituted by a second metal film 420 and a second common electrode wire 415B that is a laminated structure of a first transparent electrode film 419 and a third metal film 430. The first common electrode wire 415A and the second common electrode wires 415B are disposed to both extend along the Y-axis direction and overlap each other, and are substantially equal in line width to each other. Moreover, through an interlayer insulating film 428 sandwiched between the second metal film 420, which constitutes the first common electrode wire 415A, and a first transparent electrode film 419 that constitutes part of the second common electrode 415B, a common electrode wire contact hole (contact hole) 31 is bored in such a position as to overlap the two common electrode wires 415A and 415B. The two common electrode wires 415A and 415B, placed in such a manner that the interlayer insulating film 428 is sandwiched therebetween, are electrically connected to each other through the common electrode wire contact hole 31. A plurality of the common electrode wire contact holes 31 are placed in positions of the interlayer insulating film 428 that are located between two gate lines 411i interposed between pixel electrodes 411g arranged along the Y-axis direction, i.e. positions of the interlayer insulating film 428 that do not overlay the pixel electrodes 411g. Accordingly, the plurality of common electrode wire contact holes 31 include one that overlaps a contact hole 423 for connecting a touch electrode 414 with the common electrode wire 415. In this way, even in the case of breakage of either the first common electrode wire 415A or the second common electrode wire 415B, the common electrode wire 415 can fulfil its electrical function, unless the other common electrode wire is not broken. This suitable to maintaining redundancy. Moreover, since the first common electrode wire 415A constituted by the second metal film 420 and the second common electrode wires 415B including the first transparent electrode film 419 overlap each other and are connected to each other through the common electrode wire contact hole 31 bored through the interlayer insulating film 428, the interconnection resistance of the common electrode wire 415 can be suitably reduced, whereby further improvement in position detection sensitivity can be achieved. Further, the distance between the source lines 411j and the touch electrode 414 becomes greater than in a case described in the first embodiment where the source lines 11j and the common electrode wire 15 are disposed at the same level. This reduces parasitic capacitances that may be formed between the source lines 411j and the touch electrode 414, thereby making position detection sensitivity and display quality higher.

As described above, a liquid crystal display device according to the present embodiment further includes: a first transparent electrode film 419; a second transparent electrode film 422, the first transparent electrode film 419 constituting the pixel electrodes 411g when the second transparent electrode film 422 constitutes the common electrode 411h, the first transparent electrode film 419 constituting the common electrode 411h when the second transparent electrode film 422 constitutes the pixel electrodes 411g, the inter-transparent-electrode-film insulating film 421 being sandwiched between the first transparent electrode film 419 and the second transparent electrode film 422; and a second metal film 420 placed on a side of the first transparent electrode film 419 opposite to the second transparent electrode film 422 with an interlayer insulating film 428 sandwiched between the first transparent electrode film 419 and the second metal film 420, and while the second metal film 420 constitutes at least parts of the source lines 411j and a first common electrode wire 415A that is part of the common electrode wire 415, the first transparent electrode film 419 constitutes a second common electrode wire 415B that is part of the common electrode wire 415, that is placed in such a manner as to overlap the first common electrode wire 415A, and that is connected to the first common electrode wire 415A through a common electrode wire contact hole (contact hole) 31 bored through the interlayer insulating film 428. In this way, even in the case of breakage of either the first common electrode wire 415A or the second common electrode wire 415B, the common electrode wire 415 can fulfil its electrical function, unless the other common electrode wire is not broken. This suitable to maintaining redundancy. Moreover, since the first common electrode wire 415 constituted by the second metal film 420 and the second common electrode wires 415B including the first transparent electrode film 419 overlap each other and are connected to each other through the common electrode wire contact hole 31 bored through the interlayer insulating film 428, the interconnection resistance of the common electrode wire 415 can be reduced. Further, since the second metal film 420 constitutes at least parts of the source lines 411j, the distance between the source lines 411j and the common electrode 411h becomes greater than in a case where a first transparent electrode film constitutes at least parts of the source lines 411j. This reduces parasitic capacitances that may be formed between the source lines 411j and the common electrode 411h, thereby making display quality higher.

Sixth Embodiment

A sixth embodiment of the present invention is described with reference to FIG. 19. The sixth embodiment illustrates a change in arrangement of leads 526 and 527 from the second embodiment. It should be noted that a repeated description of structures, actions, and effects which are similar to those of the second embodiment is omitted.

Figure 19:
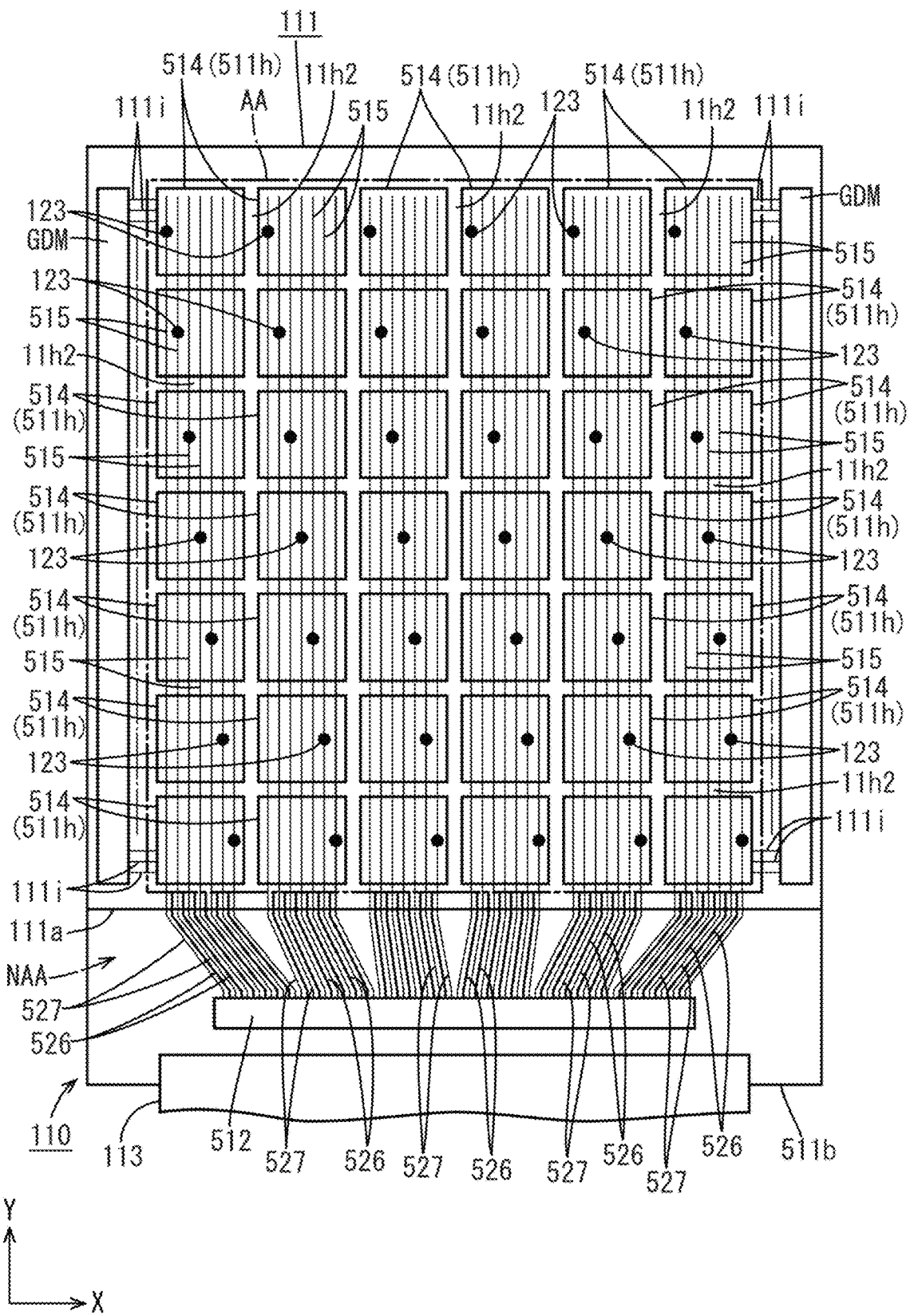
FIG. 19 is a plan view of a liquid crystal panel according to a sixth embodiment of the present invention.

As shown in FIG. 19, the source leads 526 and the common electrode leads 527 according to the present embodiment are routed in such a manner as to be parallel to each other in the non-display area NAA of an array substrate 511b. In particular, large numbers of source leads 526 and common electrode leads 527 are routed in substantially fan-like fashion from the display area AA where source lines (not illustrated) and common electrode wires 515 to which they are connected are placed, and avoid crossing each other en route by extending parallel to each other until they reach a driver 512. This makes it hard for parasitic capacitances to be formed between the source leads 526 and the common electrode leads 527, thus making position detection sensitivity and display quality higher. Further, circuits for outputting image signals to the source leads 526 and circuits for outputting touch signals to the common electrode leads 527 are dispersed over substantially the entire length of the driver 512.

As described above, a liquid crystal display device according to the present embodiment further includes: a display area AA where at least the pixel electrodes 511g, the common electrode 511h (touch electrode 514), the common electrode wire 515, and the source lines are placed and an image is displayed; a non-display area NAA that surrounds the display area AA; a driver (drive circuit unit) 512 that is mounted in the non-display area NAA; source leads (signal leads) 526, placed in the non-display area NAA, that have their first ends connected to the source lines and their second ends connected to the driver 512; and common electrode leads 527, placed in the non-display area NAA, that have their first ends connected to the common electrode wire 515 and their second ends connected to the driver 512, and the source leads 526 and the common electrode leads 527 extend parallel to each other. In this way, signals outputted from the driver 512 are transmitted to the source lines via the source leads 526 and to the common electrode wires 515 via the common electrode leads 527, respectively. Since the source leads 526 and the common electrode leads 527 avoid crossing each other en route by extending parallel to each other, parasitic capacitances are hardly formed between the source leads 526 and the common electrode leads 527. This makes display quality high.

Other Embodiments

The present invention is not limited to the embodiments described above with reference to the drawings. The following embodiments may be included in the technical scope of the present invention.

Figure 20:
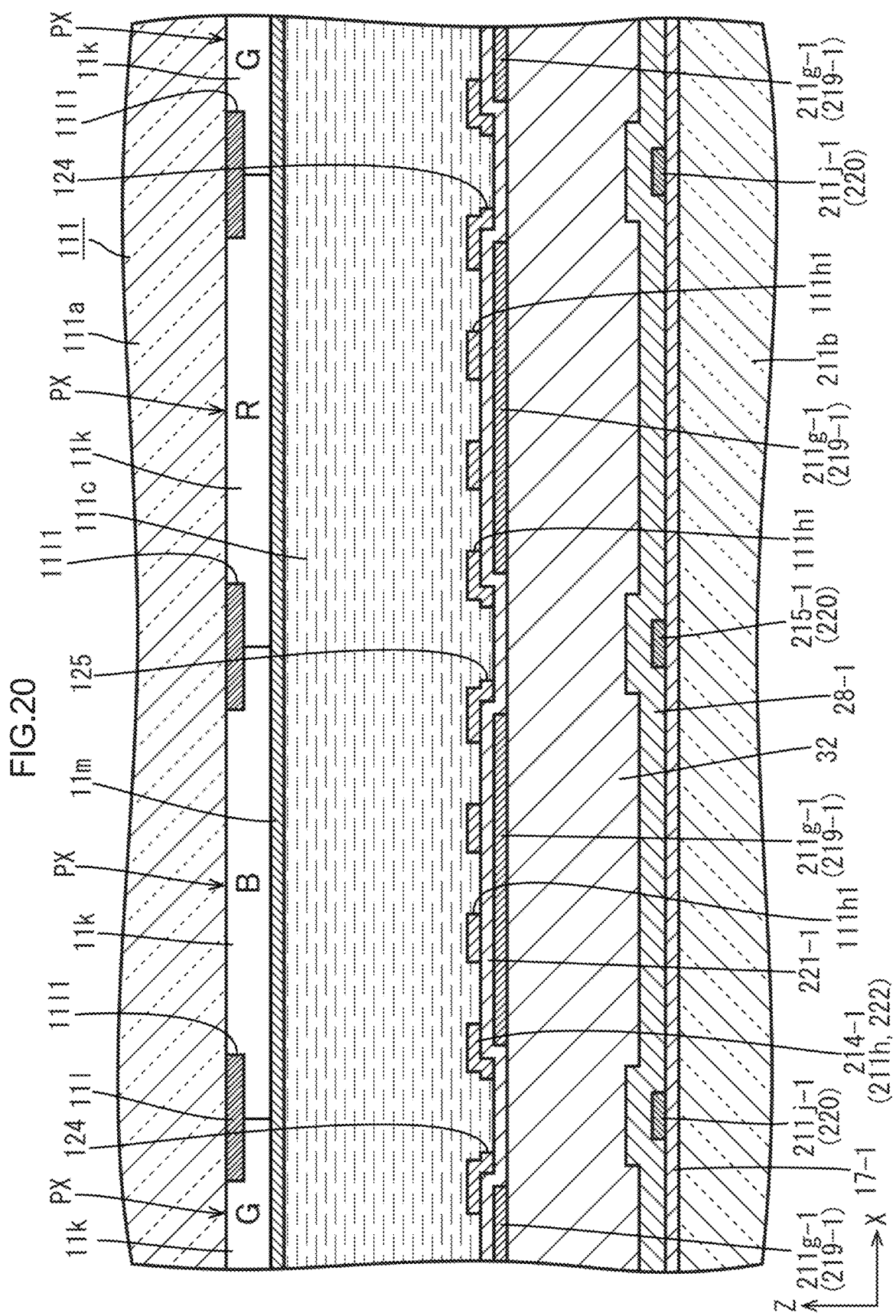
FIG. 20 is a cross-sectional view of a pixel unit of a liquid crystal panel according to another embodiment (1) of the present invention as taken along a line near the centers of pixel units.

(1) In Modification 1 of the third embodiment, as shown in FIG. 20, a planarizing film 32 made of an organic material such as acrylic resin material may be added between an interlayer insulating film 28-1 and a first transparent electrode film 219-1. The planarizing film 32 is larger in film thickness than any of insulating films 17-1, 28-1, and 221-1 each made of an inorganic material. Such a configuration makes it possible to increase the spacings between source lines 211$j$-1 and pixel electrodes 211$g$-1, between the source lines 211$j$-1 and a touch electrode 214-1, between a common electrode wire 215-1 and the pixel electrodes 211$g$-1, and between the common electrode wire 215-1 and the touch electrode 214-1, thus making position detection sensitivity and display quality higher.

Figure 21:
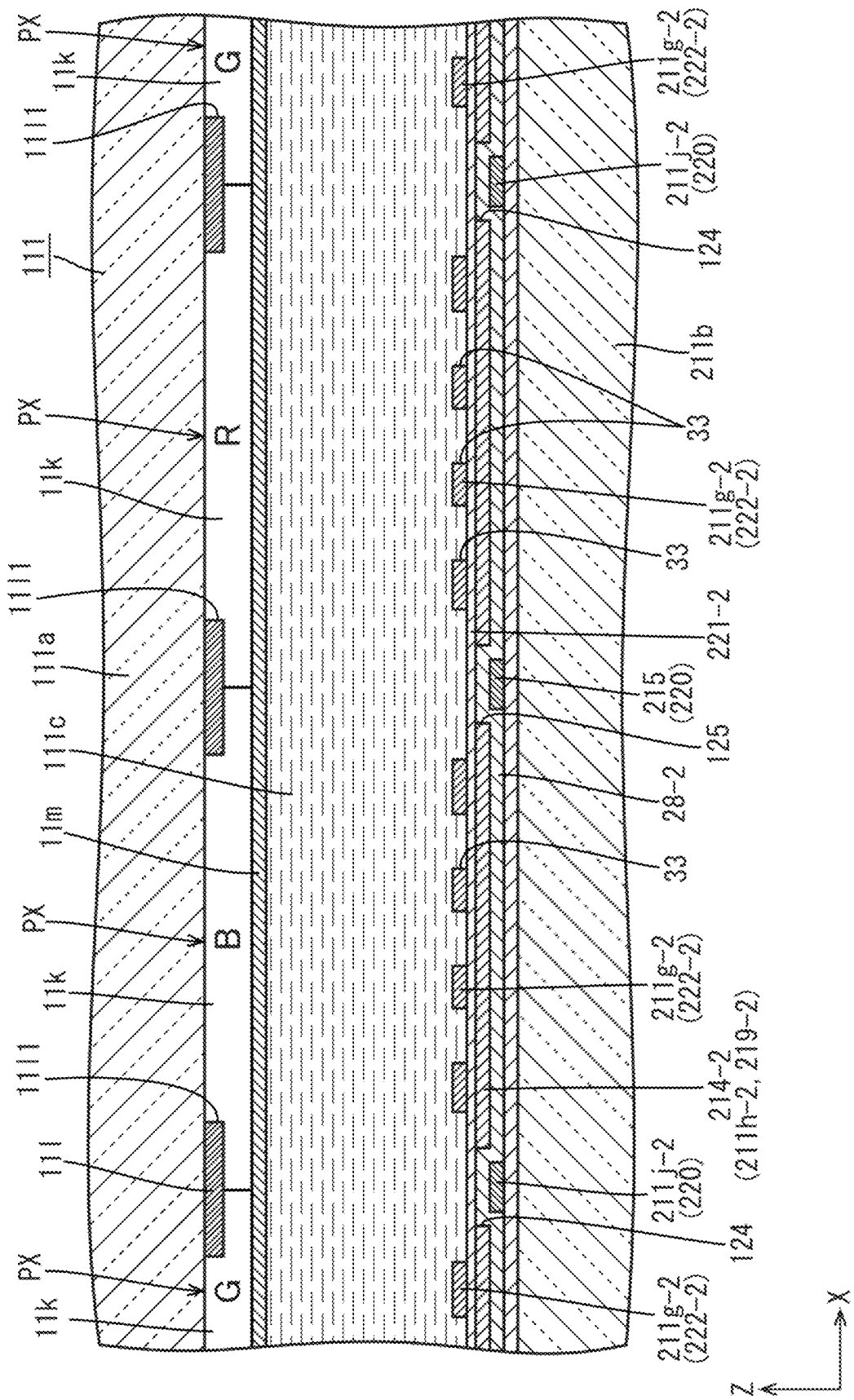
FIG. 21 is a cross-sectional view of a pixel unit of a liquid crystal panel according to another embodiment (2) of the present invention as taken along a line near the centers of pixel units.

(2) In Modification 2 of the third embodiment, as shown in FIG. 21, a common electrode 211$h$-2 and a touch electrode 214-2 may exchange places with pixel electrodes 211$g$-2. While the common electrode 211$h$-2 and the touch electrode 214-2 are constituted by a first transparent electrode film 219-2, the pixel electrodes 211$g$-2 are constituted by a second transparent electrode film 222-2. In this way, since an interlayer insulating film 28-2 and an inter-transparent-electrode-film insulating film 221-2 are sandwiched between source lines 211$j$-2 and the pixel electrodes 211$g$-2, the spacing between the source lines 211$j$-2 and the pixel electrodes 211$g$-2 become greater by the film thickness of the inter-transparent-electrode-film insulating film 221-2, whereby improvement in display quality is achieved. It should be noted that the pixel electrodes 211$g$-2 are provided with common electrode overlap openings 33 as structures equivalent to the pixel overlap openings 11$h$1 (see FIG. 4) described in the first embodiment in such a manner as to overlap the common electrode 211$h$-2.

Figure 22:
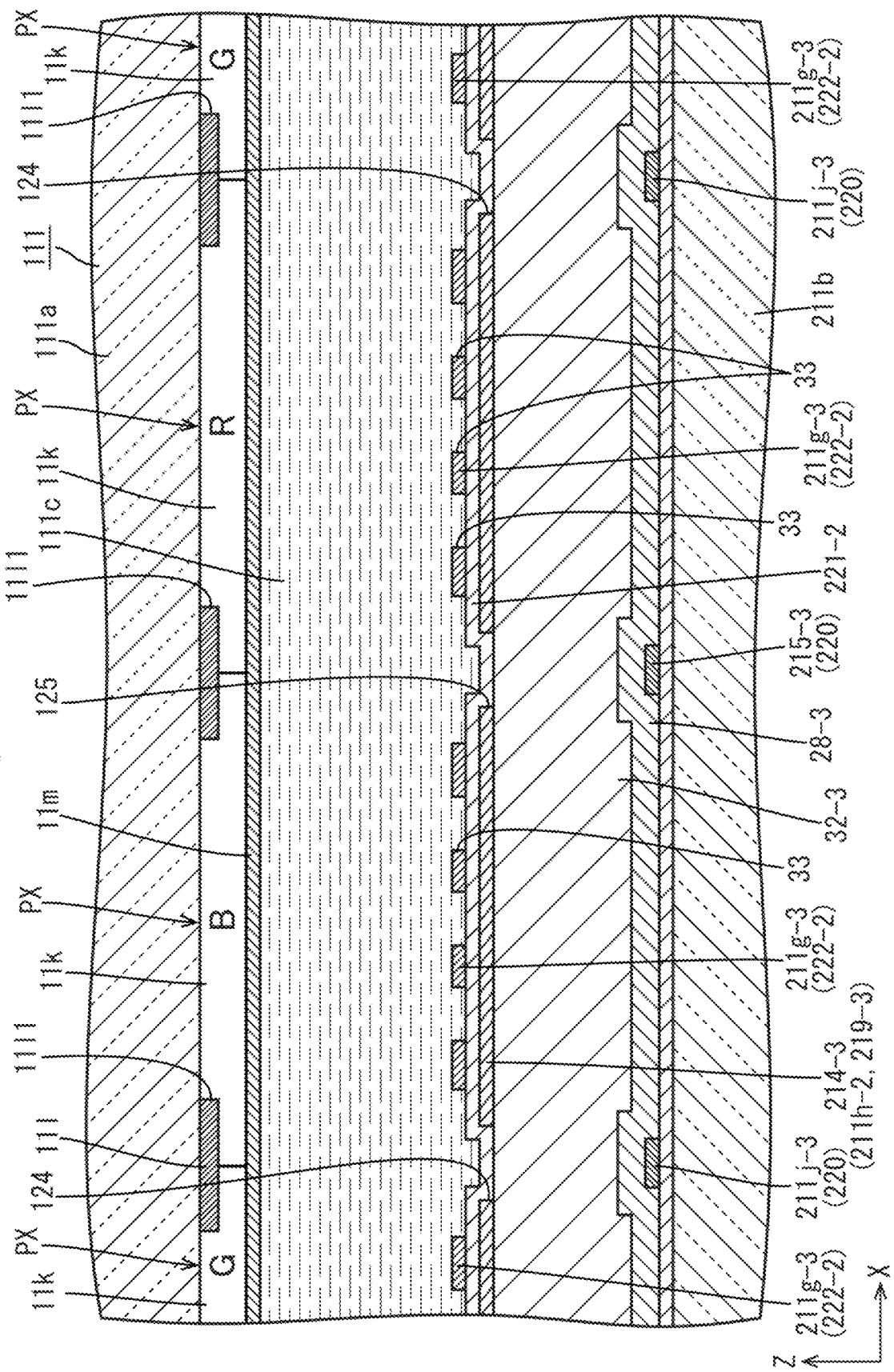
FIG. 22 is a cross-sectional view of a pixel unit of a liquid crystal panel according to another embodiment (3) of the present invention as taken along a line near the centers of pixel units.

(3) In Modification 3 of the third embodiment, as shown in FIG. 22, a planarizing film 32-3 which is similar to that of Modification 1 of (1) described above may be added to the configuration of Modification 2 of (2) described above. The planarizing film 32-3 is sandwiched between an interlayer insulating film 28-3 and a first transparent electrode film 219-3. This increases the spacings between source lines 211$j$-3 and pixel electrodes 211$g$-3, between the source lines 211$j$-3 and a touch electrode 214-3, between a common electrode wire 215-3 and the pixel electrodes 211$g$-3, and between the common electrode wire 215-3 and the touch electrode 214-3, thus making position detection sensitivity and display quality higher.

Figure 23:
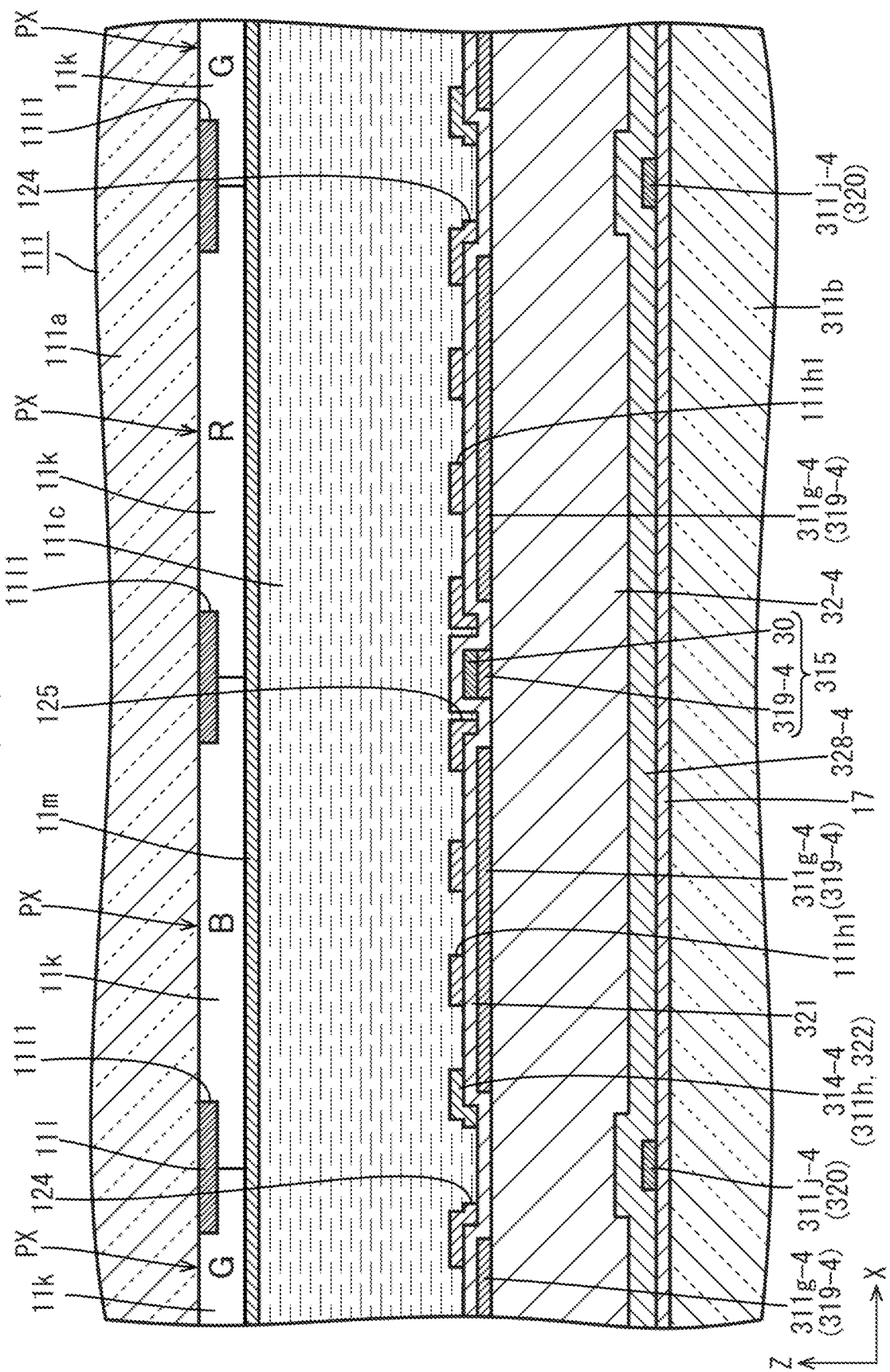
FIG. 23 is a cross-sectional view of a pixel unit of a liquid crystal panel according to another embodiment (4) of the present invention as taken along a line near the centers of pixel units.

(4) In Modification 4 of the fourth embodiment, as shown in FIG. 23, a planarizing film 32-4 which is similar to that of Modification 1 of (1) described above may be added between an interlayer insulating film 328-4 and a first transparent electrode film 319-4. This increases the spacings between gate lines (not illustrated) and pixel electrodes 311$g$-4, between the gate lines and a touch electrode 314-4, between source lines 311$j$-4 and the pixel electrodes 311$g$-4, and between the source lines 311$j$-4 and the touch electrode 314-4, thus making position detection sensitivity and display quality higher.

Figure 24:
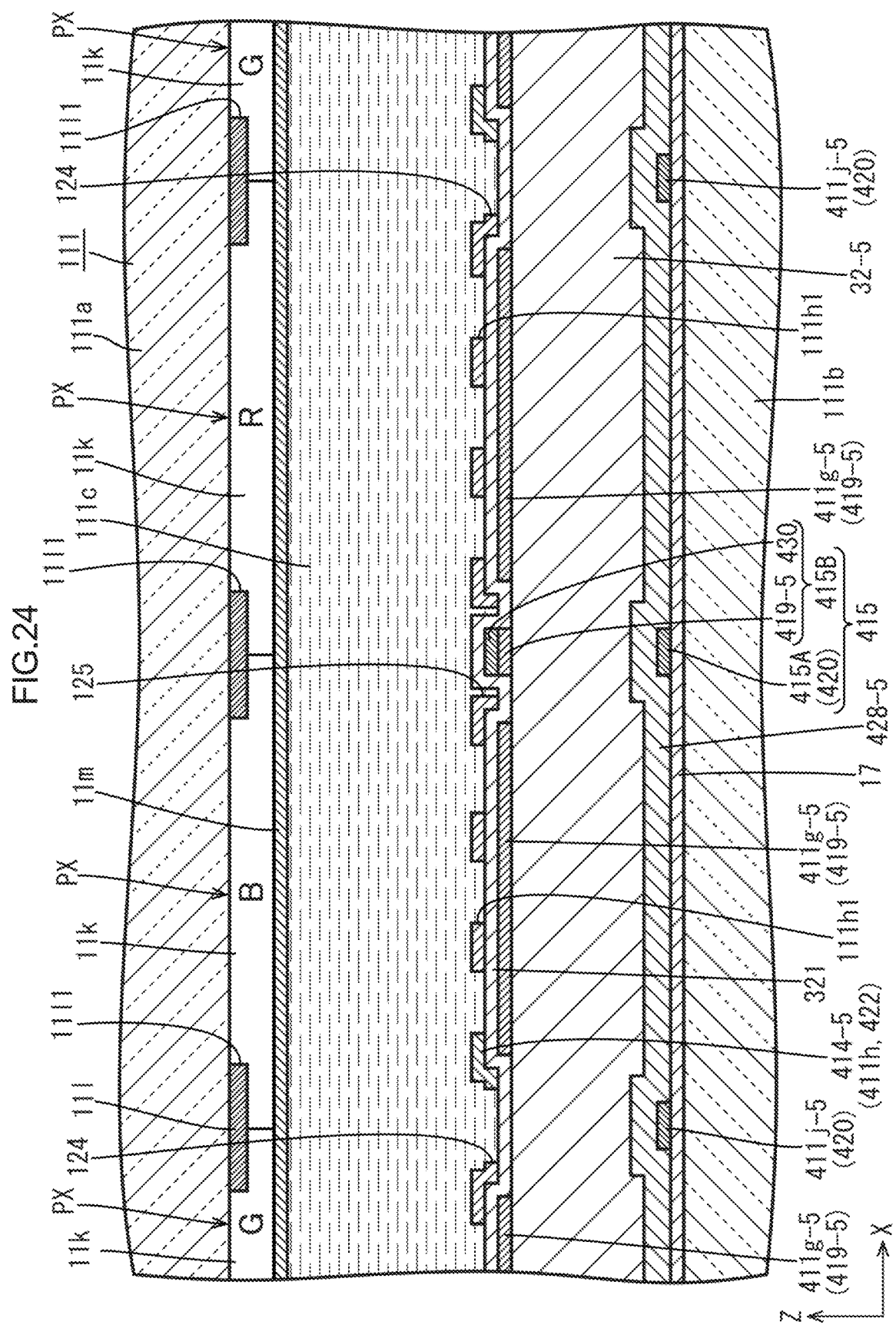
FIG. 24 is a cross-sectional view of a pixel unit of a liquid crystal panel according to another embodiment (5) of the present invention as taken along a line near the centers of pixel units.

(5) In Modification 5 of the fifth embodiment, as shown in FIG. 24, a planarizing film 32-5 which is similar to that of Modification 1 of (1) described above may be added between an interlayer insulating film 428-5 and a first transparent electrode film 419-5. This increases the spacings between gate lines (not illustrated) and pixel electrodes 411$g$-5, between the gate lines and a touch electrode 414-5, between source lines 411$j$-5 and the pixel electrodes 411$g$-5, and between the source lines 411$j$-5 and the touch electrode 414-5, thus making position detection sensitivity and display quality higher.

(6) In a modification of the first and second embodiments, the source lines and the common electrode wire may be constituted solely by the second metal film. Further, in a modification of the fourth embodiment, the common electrode wire may be constituted solely by the third metal film. Further, in a modification of the fifth embodiment, the second common electrode wire may be constituted solely by the third metal film. Alternatively, the third metal film may be omitted, and in that case, the second common electrode wire is constituted solely by the first transparent electrode film. Further, besides each embodiment, the specific installation number, planar shape, formation range, and the like of pixel overlap openings over pixel electrodes are subject to change as appropriate. Further, in the configuration described in each embodiment (except for the third embodiment), the common electrodes (touch electrodes) and the pixel electrodes may exchange places with each other in an application of the technical matter described in Modification 2 of (2) described above.

(7) Besides each embodiment, the arrangement, opening range, and the like of the source line overlap openings and the common electrode overlap openings in the X-axis direction and the Y-axis direction are subject to change as appropriate. Further, the specific planar arrangement and the like of the contact holes for connecting the common electrodes with the common electrode wires are subject to change as appropriate. Further, besides each embodiment, the gate lines, the source lines, and the common electrode wires may extend in such a manner as to be bent en route. Further, besides each embodiment, the light shield may be provided on the side of the array substrate. Further, besides each embodiment, the semiconductor film may be polysilicon, and in that case, it is preferable that the TFTs be of a bottom gate type. Further, besides each embodiment, the touch panel pattern may be of a mutual capacitive type. Further, besides each embodiment, the liquid crystal panel may be of a reflective type or a semi-transmissive type. Further, besides each embodiment, the planar shape of the liquid crystal display device may be a horizontally long rectangle, a square, a circle, a semicircle, an oval, an ellipse, a trapezoid, or the like. Further, besides each embodiment, the display panel may have functional organic molecules other than a liquid crystal material sandwiched between two substrates.

EXPLANATION OF SYMBOLS 10, 110: Liquid crystal display device (position-input-function-equipped display device)

11*f*, 111*f*, 211*f*: TFT (switching element)
11*g*, 111*g*, 211*g*, 211*g*-1, 211*g*-2, 211*g*-3, 311*g*, 311*g*-4, 411*g*, 411*g*-5: Pixel electrode
11*h*, 111*h*, 211*h*, 211*h*-2, 311*h*, 411*h*, 511*h*: Common electrode
11*h*2: Partition opening
11*i*, 111*i*, 211*i*, 311*i*, 411*i*: Gate line (scanning line)
11*j*, 111*j*, 211*j*, 211*j*-1, 211*j*-2, 211*j*-3, 311*j*, 311*j*-4, 411*j*, 411*j*-5: Source line (signal line)
12, 112, 512: Driver (drive circuit unit)
14, 214, 214-1, 214-2, 214-3, 314, 314-4, 414, 414-5, 514: Touch electrode (position detection electrode)
15, 115, 215, 215-1, 215-3, 315, 415, 515: Common electrode wire (position detection line)
19, 219, 219-1, 219-2, 219-3, 319, 319-4, 419, 419-5: First transparent electrode film (conducting film, transparent electrode film)
20, 220, 320, 420; Second metal film (conducting film, metal film)
21, 221, 221-1, 221-2, 321, 421: Inter-transparent-electrode-film insulating film (insulating film)
22, 222, 222-2, 322, 422: Second transparent electrode film
23, 123, 223, 323, 423: Contact hole
24, 124: Source line overlap opening (signal line overlap opening)
26, 526: Source lead (signal lead)
27, 527: Common electrode lead
28, 28-1, 28-2, 28-3, 328, 328-4, 428, 428-5: Interlayer insulating film
31: Common electrode wire contact hole (contact hole)
415A: First common electrode wire
415B: Second common electrode wire
AA: Display area
NAA: Non-display area

The invention claimed is:

1. A display device comprising:
a plurality of pixel electrodes arranged at intervals;
a common electrode including portions that overlap the plurality of pixel electrodes;
an insulating film between the common electrode and the plurality of pixel electrodes;
at least two signal lines separated from each other such that some of the plurality of pixel electrodes that are arranged along the at least two signal lines are between the at least two signal lines, the at least two signal lines supplying image signals to the plurality of pixel electrodes;
a common electrode wire parallel to the at least two signal lines and adjacent to one of the at least two signal lines such that other ones of the plurality of pixel electrodes are (i) arranged along the common electrode wire, (ii) between the common electrode wire and the one of the at least two signal lines, and (iii) not between the at least two signal lines, the common electrode wire supplying at least a reference potential signal to the common electrode,
a first transparent electrode film;
a second transparent electrode film, the first transparent electrode film defining the plurality of pixel electrodes when the second transparent electrode film defines the common electrode, the first transparent electrode film defining the common electrode when the second transparent electrode film defines the plurality of pixel electrodes, the insulating film being sandwiched between the first transparent electrode film and the second transparent electrode film; and
a metal film on a side of the first transparent electrode film opposite to the second transparent electrode film with an interlayer insulating film sandwiched between the first transparent electrode film and the metal film, wherein
while the metal film defines at least portions of the at least two signal lines and a first common electrode wire that is a portion of the common electrode wire, the first transparent electrode film defines a second common electrode wire that is a portion of the common electrode wire, that is arranged in such a manner as to overlap the first common electrode wire, and that is connected to the first common electrode wire through a contact hole in the interlayer insulating film.

2. The display device according to claim 1, wherein
the common electrode includes at least one position detection electrode to detect a position of an input by a position input body based on an electrostatic capacitance between the at least one position detection electrode and the position input body, and
the common electrode wire supplies a position detection signal to the at least one position detection electrode.

3. The display device according to claim 2, wherein
the at least one position detection electrode includes a plurality of the position detection electrodes,
the common electrode includes slits that separate the plurality of position detection electrodes from one another, and
the slits include portions that overlap at least portions of the common electrode wire.

4. The display device according to claim 2, wherein
the plurality of pixel electrodes are arranged in rows and columns,
the display device further comprises:
switching elements connected to the plurality of pixel electrodes and the at least two signal lines; and
at least two scanning lines extending in a row direction and arranged parallel to each other, the at least two scanning lines being between two of the plurality of pixel electrodes adjacent to each other in a column direction and separated from each other in the column direction, the at least two scanning lines supplying scanning signals to the switching elements, and
the at least one position detection electrode includes a plurality of the position detection electrodes, and
the common electrode includes at least one slit that separates two adjacent position detection electrodes of the plurality of position detection electrodes from each other, the at least one slit is between the at least two scanning lines.

5. The display device according to claim 1, wherein
the plurality of pixel electrodes are arranged in rows and columns,
the display device further comprises:
switching elements connected to the plurality of pixel electrodes and the at least two signal lines; and
at least two scanning lines extending in a row direction and being parallel to each other, the at least two scanning lines being between two of the plurality of pixel electrodes adjacent to each other in a column direction and separated from each other in the column direction, the at least two scanning lines supplying scanning signals to the switching elements, and the common electrode wire is connected to the common electrode through a contact hole in the insulating film, and the contact hole is located between the at least two scanning lines.

6. The display device according to claim 1, wherein the common electrode includes openings that overlap at least portions of the at least two signal lines.

7. The display device according to claim 1, wherein the common electrode wire and the at least two signal lines include portions made from a conducting film.

8. The display device according to claim 7, wherein the plurality of pixel electrodes are made from a transparent electrode film.

9. The display device according to claim 7, wherein the conducting film includes at least the metal film.

10. The display device according to claim 9, wherein the insulating film is smaller in film thickness than the interlayer insulating film.

11. The display device according to claim 1, further comprising:
a display area where at least the plurality of pixel electrodes, the common electrode, the common electrode wire, and the at least two signal lines are arranged and an image is displayed;
a non-display area that surrounds the display area;
a drive circuit that is in the non-display area;
signal leads, in the non-display area, including first ends connected to the at least two signal lines and second ends connected to the drive circuit; and
common electrode leads, in the non-display area, including first ends connected to the common electrode wire and second ends connected to the drive circuit,
wherein the signal leads and the common electrode leads extend parallel to each other.

12. The display device according to claim 1, wherein
the plurality of pixel electrodes are arranged at spacings from one another in rows and columns,
the display device further comprises:
switching elements connected to the plurality of pixel electrodes and the at least two signal lines; and
a plurality of scanning lines that supply the switching elements with scanning signals, the plurality of scanning lines being between the pixel electrodes extending along a row direction and arranged in a column direction, and
the at least two signal lines are connected via the switching elements to the plurality of pixel electrodes extending along the row direction and defining columns on both sides thereof, while different ones of the plurality of scanning lines are connected to the switching elements connected to the plurality of pixel electrodes connected to the common signal lines and defining different columns.

13. The display device according to claim 1, wherein
the plurality of pixel electrodes are arranged at spacings from one another in rows and columns,
the at least two signal lines extend along a column direction, and
the some of the plurality of pixel electrodes between the at least two signal lines and defining a column include a first pixel electrode of the plurality of pixel electrodes that is connected to a first adjacent one of the at least two signal lines and a second pixel electrode of the plurality of pixel electrodes that is connected to a second adjacent one of the at least two signal lines.

* * * * *